(12) United States Patent
Qiu et al.

(10) Patent No.: US 11,501,733 B2
(45) Date of Patent: Nov. 15, 2022

(54) PANEL SELF-REFRESH (PSR) TRANSMISSION OF BULK DATA

(71) Applicant: Intel Corporation, Santa Clara, CA (US)

(72) Inventors: Junhai Qiu, Portland, OR (US); Ajit Joshi, Portland, OR (US); Ravi Ranganathan, Sunnyvale, CA (US); Perazhi Sameer Kalathil, Bangalore (IN); Jun Jiang, Portland, OR (US); Geethacharan Rajagopalan, Gold River, CA (US); Nandini Mahendran, Portland, OR (US); Gary Smith, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 609 days.

(21) Appl. No.: 16/542,279

(22) Filed: Aug. 15, 2019

(65) Prior Publication Data

US 2020/0043440 A1   Feb. 6, 2020

(51) Int. Cl.
| | |
|---|---|
| *G09G 5/00* | (2006.01) |
| *G06F 1/3206* | (2019.01) |
| *G06F 1/3296* | (2019.01) |
| *G06F 13/16* | (2006.01) |
| *G06F 9/54* | (2006.01) |
| *G06F 9/38* | (2018.01) |
| *G06F 30/30* | (2020.01) |

(52) U.S. Cl.
CPC .......... *G09G 5/006* (2013.01); *G06F 1/3206* (2013.01); *G06F 1/3296* (2013.01); *G06F 9/3877* (2013.01); *G06F 9/544* (2013.01); *G06F 13/1636* (2013.01); *G06F 30/30* (2020.01)

(58) Field of Classification Search
CPC .......... G06F 2213/0026; G06F 1/3265; G06F 13/28; G06F 1/325; G06F 1/3206; G06F 1/3278; G06F 1/3296; G06F 1/1647; G06F 2203/04803; G06F 3/04845; G09G 5/006; G09G 3/3648
See application file for complete search history.

(56) References Cited

U.S. PATENT DOCUMENTS

| | | | | |
|---|---|---|---|---|
| 2013/0021352 | A1* | 1/2013 | Wyatt | G09G 5/395 345/520 |
| 2017/0287391 | A1* | 10/2017 | Zhuang | G06F 13/14 |
| 2018/0189224 | A1* | 7/2018 | Vadivelu | G06F 13/4282 |

FOREIGN PATENT DOCUMENTS

CN        112397019        2/2021

* cited by examiner

*Primary Examiner* — Gerald Johnson
(74) *Attorney, Agent, or Firm* — Hanley, Flight & Zimmerman, LLC

(57) ABSTRACT

The present disclosure is directed to systems and methods of transferring bulk data, such as OLED compensation mask data, generated by a source device to a sink device using a high-bandwidth embedded DisplayPort (eDP) connection contemporaneous with an ENABLED Panel Self-Refresh (PSR) mode. Upon ENABLING the PSR mode, the source control circuitry causes the source transmitter circuitry, the sink receiver circuitry, and the eDP high-bandwidth communication link to remain active rather than inactive. The source control circuitry generates one or more data transport units (DTUs) having a header portion that contains data indicative of the presence of a bulk data payload and the non-display status of the bulk data payload carried by the DTUs.

30 Claims, 12 Drawing Sheets

VSC SDP Header Extension for High Speed Data Transfer HB0 through HB3

| Byte # | Bit # | Content |
|---|---|---|
| HB0 | 7:0 | Secondary-data Packet ID = 0 |
| HB1 | 7:0 | Secondary-data Packet Type=07h |
| HB2 | 4:0 | Revision Number<br>01h = 3D Stereo<br>02h = PSR<br>03h = 3D Stereo + PSR2<br>04h = 3D Stereo + PSR2 + Y-coordinate<br>05h = 3D Stereo + PSR2 + Y-coordinate + Pixel encoding/colorimetry format<br>06h = 3D Stereo + PSR + High Speed Data Transfer |
| | 7:5 | RESERVED<br>Read all 0s |
| HB3 | 4:0 | Number of Valid Data Types<br>01h = 3D Stereo<br>08h = PSR<br>0Ch = 3D Stereo + PSR2<br>0Eh = 3D Stereo + PSR2 + Y-coordinate<br>13h = 3D Stereo + PSR2 + Y-coordinate + Pixel encoding/colorimetry format<br>0Eh = 3D Stereo + PSR + High Speed Data Transfer |
| | 7:5 | RESERVED<br>Read all 0s |

FIG. 8

| VSC SDP Header Extension for High Speed Data Transfer DB1 through DB7 | | |
|---|---|---|
| Byte # | Bit # | Content |
| DB0 | 7:0 | Used for 3D Stereo |
| DB1 | 0 | PSR State<br>0 = PSR Inactive<br>1 = PSR active |
| | 1 | Update RFB<br>0 = Do not update RFB<br>1 = Update the RFB<br>Ignored if PSR state bit in the previous VSC SDP or this SDP is 0. |
| | 2 | CRC Valid<br>0 = CRC Values in DB7-DB2 are invalid<br>1 = CRC Values in DB7-DB2 are valid |
| | 3 | High Speed Data Transfer Valid<br>0 = Active frame carries video data<br>1 = Active frame carries non-video data.<br>Ignored if PSR state bit in the previous VSC SDP or this SDP is 0.<br>Ignored if "Update RFB" bit is 1. |
| | 7:4 | RESERVED<br>Read all 0s |
| DB2 | 7:0 | CRC Value Bits 7:0 of the R or Cr Component |
| DB3 | 7:0 | CRC Value Bits 15:8 of the R or Cr Component |
| DB4 | 7:0 | CRC Value Bits 7:0 of the G or Y Component |
| DB5 | 7:0 | CRC Value Bits 15:8 of the G or Y Component |
| DB6 | 7:0 | CRC Value Bits 7:0 of the B or Cb Component |
| DB7 | 7:0 | CRC Value Bits 15:8 of the B or Cb Component |

FIG. 9A

VSC SDP Header Extension for High Speed Data Transfer DB8 through DB13

| Byte # | Bit # | Content |
|---|---|---|
| DB8 | 1:0 | Type of non-video data<br>1 = Panel Firmware<br>2 = OLED compensation data |
|  | 7:2 | RESERVED<br>Read all 0s |
| DB9 | 1:0 | Transfer flag.<br>00 = setup of transfer. Set when sink device can't complete entry setup within frame.<br>01 = start of transfer<br>10 = middle of transfer<br>11 = end of transfer. Set when frame carries the last or the only chunk of non-video data. |
|  | 3:2 | Sequence number. Shall be cleared to 0 on the first video frame carrying non-video data. This counter rolls over to 0 when it exceeds 3. |
|  | 7:4 | RESERVED<br>Read all 0s |
| DB10 | 7:0 | Size of non-video data, 0:7. |
| DB11 | 7:0 | Size of non-video data, 8:15 |
| DB12 | 7:0 | Size of non-video data, 16:23 |
| DB13 | 7:0 | RESERVED |

FIG. 9B

PANEL SELF-REFRESH (PSR) TRANSMISSION OF BULK DATA

TECHNICAL FIELD

The present disclosure relates to transferring data between a source device and sink device using a high-bandwidth interconnect such as DisplayPort.

BACKGROUND

Devices such as modern OLED display devices occasionally require the transfer of a large volume of data associated with operation of the display device. For example, OLED devices may require a significant quantity of mask data to compensate for (or mask) the uneven degradation of the organic materials used to fabricate the OLED display. Typically, this compensation data is generated and performed by the display device itself. Such compensation data is typically per-pixel based and may require 10-bits per component for an embedded standard dynamic range (SDR) OLED panel or 12-bits per component for an embedded high dynamic range (HDR) OLED panel.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

FIG. 8 is an example header portion associated with an illustrative DTU communicated from the source transmitter circuitry to the sink receiver circuitry contemporaneous with the source control circuitry ENABLING PSR mode in the sink device, in accordance with at least one embodiment described herein;

FIG. 9A is a first portion (data byte 0 through data byte 7) of an example header portion associated with an illustrative DTU communicated from the source transmitter circuitry to the sink receiver circuitry contemporaneous with the source control circuitry ENABLING PSR mode in the sink device, in accordance with at least one embodiment described herein;

FIG. 9B is a first portion (data byte 8 through data byte 13) of the example header portion associated with the illustrative DTU communicated from the source transmitter circuitry to the sink receiver circuitry contemporaneous with the source control circuitry ENABLING PSR mode in the sink device, in accordance with at least one embodiment described herein;

Figure 1A:
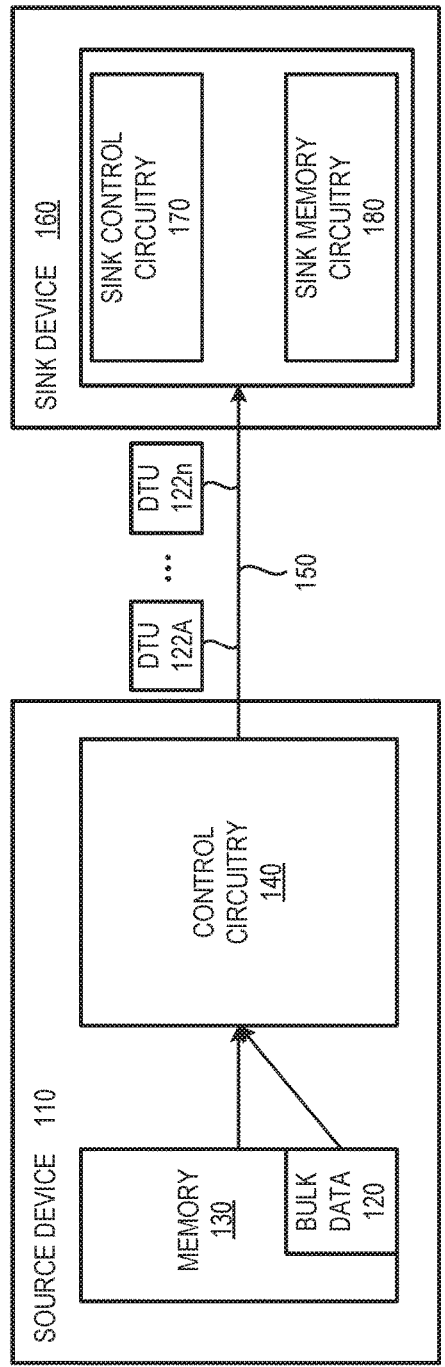
FIG. 1A is a schematic diagram of an illustrative system in which a source device generates bulk data that is stored in memory circuitry and in which a high-bandwidth link 150 communicatively couples the source device to a sink device, in accordance with at least one embodiment described herein.

Although the following Detailed Description will proceed with reference being made to illustrative embodiments, many alternatives, modifications and variations thereof will be apparent to those skilled in the art.

DETAILED DESCRIPTION

The systems and methods disclosed herein provide a hybrid solution to the transfer of bulk data from a source (i.e., a data generator or producer) device to a sink (i.e., a data consumer) device. For example, the systems and methods disclosed herein may be used to perform OLED degradation modeling on a source device, such as a system-on-chip (SoC), to generate compensation data that is communicated to a sink device, such as an OLED panel. The transfer of such bulk data over existing interfaces such as I2C, AUX channel or chainable in-band Secondary Data Packet (SDP) would require an extended time (minutes, hours, or even days) to complete for a 4K panel. The systems, methods, and data transport units that employ a high-speed interface to transfer bulk data from a source device to a sink device. For example, the systems, methods, and data transport units described herein may be used to communicate or transfer non-video data generated on an SoC to an OLED display panel using an extension of Panel Self-Refresh (PSR) without necessitating a change in SoC hardware. Thus, the systems and methods disclosed herein may be deployed to transfer OLED display compensation data from a source device to an embedded sink device, such as an embedded display panel.

A source device capable of enabling source transmitter circuitry, sink receiver circuitry, and a high-bandwidth communications link contemporaneous with an ENABLED Panel Self-Refresh (PSR) mode is provided. The source device including: source memory circuitry; source transmitter circuitry to communicatively couple to sink receiver circuitry via a high-bandwidth communication link; and source control circuitry communicatively coupled to the source transmitter circuitry, the source control circuitry to: cause a storage of bulk data in the source memory circuitry; initiate ENABLING a Panel Self Refresh (PSR) mode: cause the source transmitter circuit, the sink receiver circuit, and a high-bandwidth communication link between the source transmitter circuit and the to remain in an active state; generate a first data transport unit (DTU) having a header portion that includes data indicative of entry to a PSR/DATA TRANSFER mode and a data portion that includes a bulk data payload; and cause the source transmitter circuitry to communicate the first DTU to the sink receiver circuitry.

A sink device capable of receiving a bulk data via a high-bandwidth communications link contemporaneous with an ENABLED Panel Self-Refresh (PSR) mode is provided. The sink device may include: sink memory circuitry including: a frame buffer data storage portion; and a bulk data storage portion; sink receiver circuitry coupleable to source transmitter circuitry via a high-bandwidth communications link; and sink control circuitry coupled to the sink memory circuitry, the sink control circuitry to, responsive to receipt of a first data transport unit (DTU) having a header portion and a data portion, the header portion including data indicative of an ENABLED panel self-refresh (PSR) mode and a data portion that includes image data for display: store the image data in the frame buffer data storage portion of the sink memory circuitry; display the stored image data contemporaneous with the ENABLED PSR mode; and store bulk data received from the source transmitter circuitry in the bulk data storage portion of sink memory circuitry A method of communicating bulk data between a source device and a sink device contemporaneous with an ENABLED PSR mode is provided. The method may include: maintaining, by source control circuitry, a source transmitter circuit, a sink receiver circuit, and a high-bandwidth connection in an ACTIVE state contemporaneous with an ENABLED Panel Self Refresh (PSR) mode; and generating, by the source control circuitry, a first Data Transport Unit (DTU) to communicate from the source transmitter circuit to the sink receiver circuit contemporaneous with the ENABLED Panel Self Refresh (PSR) mode, the first DTU including a header portion containing information indicative of a bulk data transfer and a data portion containing non-display bulk data, wherein the bulk data transfer to occur contemporaneous with at least a portion of the ENABLED PSR.

A system for communicating bulk data between a source device and a sink device contemporaneous with an ENABLED PSR mode is provided. The system may include: means for maintaining a source transmitter circuit, a sink receiver circuit, and a high-bandwidth connection in an ACTIVE state contemporaneous with an ENABLED Panel Self Refresh (PSR) mode; and means for generating a first Data Transport Unit (DTU) to communicate from the source transmitter circuit to the sink receiver circuit contemporaneous with the ENABLED Panel Self Refresh (PSR) mode, the first DTU including a header portion containing information indicative of a bulk data transfer and a data portion containing non-display bulk data, wherein the bulk data transfer to occur contemporaneous with at least a portion of the ENABLED PSR A non-transitory storage device is provided. The non-transitory storage device includes instructions that, when executed by source control circuitry, cause the source control circuitry to: cause a storage of bulk data in the source memory circuitry; in response to ENABLING a Panel Self-Refresh (PSR) mode: cause the source transmitter circuit, the sink receiver circuit, and a high-bandwidth communication link between the source transmitter circuit and the to remain in an active state; generate a first data transport unit (DTU) having a header portion that includes data indicative of entry to a PSR/DATA TRANSFER mode and a data portion that includes a bulk data payload; and cause the source transmitter circuitry to communicate the first DTU to the sink receiver circuitry.

Figure 1B:
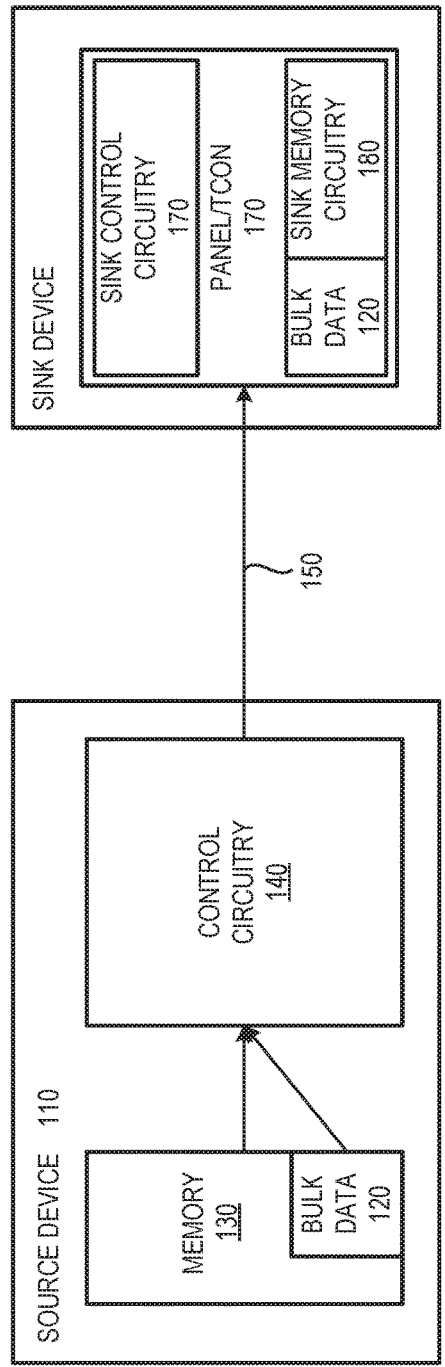
FIG. 1B is a schematic diagram of the illustrative system in which the source device has transferred the bulk data to memory circuitry local to the sink device via the high-bandwidth link, in accordance with at least one embodiment described herein.

Another non-transitory storage device is provided. The non-transitory storage device includes instructions that, when executed by sink control circuitry disposed in a sink device, cause the sink control circuitry to: store data representative of a current image in the frame buffer data storage portion of the sink memory circuitry; display the stored image data contemporaneous with the ENABLED PSR mode; and store bulk data received from the source transmitter circuitry in the bulk data storage portion of sink memory circuitry An electronic device is provided. The electronic device may include: a source device that includes source control circuitry having DisplayPort (DP) interface; a sink device that includes sink control circuitry having a DP interface, the sink device coupled to the source device via a DP communications link; wherein, the source control circuitry to: generate bulk data; generate a first data transfer unit (DTU) having a header portion and a data portion, the header portion including data indicative of an ENABLED Panel Self-Refresh (PSR) mode; maintain source transmitter circuitry, sink receiver circuitry and the DP communications link in an active state contemporaneous with the ENABLED PSR mode; communicate the first DTU to the sink device via the DP communications link; communicate one or more second DTUs to the sink device, each of the one or more second DTUs including a header portion that includes information that identifies the respective second DTU as containing at least a portion of the bulk data and an indicator that the bulk data included in the respective DTU represents non-display data; wherein, the sink device includes circuitry to: receive the first DTU; enter a Panel Self-Refresh (PSR) mode to cause a display of data stored in frame buffer memory circuitry local to the sink device; receive the one or more second DTUs; and store the bulk data contained in the data portion of each of the one or more second DTUs in sink memory circuitry FIG. 1A is a schematic diagram of an illustrative system 100 in which a source device 110 generates bulk data 120 that is stored in memory circuitry 130 and in which a high-bandwidth link 150 communicatively couples the source device 110 to a sink device 160, in accordance with at least one embodiment described herein. FIG. 1B is a schematic diagram of the illustrative system 100 in which the source device 110 has transferred the bulk data 120 to memory circuitry local to the sink device 160 via the high-bandwidth link 150, in accordance with at least one embodiment described herein. As depicted in FIGS. 1A and 1B, in embodiments, the bulk data 120 may be transferred as a number of data transfer units (DTUs) generated by the source control circuitry 140 from the source memory circuitry 130 to the sink memory circuitry 170.

In embodiments, when in operation, the source/SoC device 110 generates video data that the control circuitry 140 communicates to the sink/display device 160 via a high-speed communications link 150, such as DisplayPort (DP). Upon receipt of the data, sink control circuitry 170, such as timing controller (TCON) circuitry causes the display of the received video data. Since video refresh rates typically occur at 30 Hertz or greater, and since video data frequently remains unchanged from frame to frame, it becomes possible to save power by causing the sink/display device 160 to store the frame image internally within a frame buffer thereby obviating the need for the source/SoC device 160 to transmit the same video data over the high-speed/DP communications link 150. This mode of operation may be referred to as "Panel Self-Refresh" or "PSR" mode. When enabled, the transmitter/transceiver circuitry in the source/SoC device 110 and the receiver/transceiver circuitry in the sink/display device 160 may also be placed in a low-power or standby mode, further contributing to the power savings. When the source/SoC device 110 generates new video data, PSR mode is disabled, the source transmitter circuitry and sink receiver circuitry reactivated and video data once again flows from the source/SoC device 110 to the sink/display device 160.

The systems and methods disclosed herein beneficially and advantageously take advantage of the availability of the high-bandwidth/DP communications link 150 to communicate bulk data, such as organic light emitting diode (OLED) compensation data generated by the source/SoC device 110 to the sink/display device 160 while the sink/display device 160 remains in a PSR mode. To enable such a transfer across the relatively high-bandwidth/DP communications link 150, the DP protocol is modified to incorporate data transfer units (DTUs) that cause the sink/display device 160 to enter PSR mode and display image data stored in the frame buffer AND maintain at least the transmitter circuitry in the source/SoC device 110, the receiver circuitry in the sink/display device 160, and the high-bandwidth/DP communications link 150 in an ACTIVE or ENABLED state. Such an arrangement allows the transfer of one or more frames containing non-display, bulk, data across the high-bandwidth/DP communications link 150. The bulk data transferred to the sink/display device 160 is stored locally within the sink/display device 160 and selectively read from the local memory on an "as needed" or similar basis.

Referring to FIG. 1A, the source device 110 generates bulk data 120 that is stored locally in source memory circuitry 130. Upon enabling PSR mode, the source control circuitry 140 may first determine whether a bulk data transfer to the sink device 160 is pending. If the source control circuitry 140 determines that no transfer of bulk data 120 is pending, the source control circuitry 140 may cause the sink device 160 to enter PSR mode and cause the source device transmitter circuitry, the sink device receiver circuitry, and the high-bandwidth communication link 150 to enter a relatively low-power STANDBY mode. If the source control circuitry 140 determines that a transfer of bulk data 120 is pending, the source control circuitry 140 may cause the sink device 160 to enter PSR mode and cause the source device transmitter circuitry, the sink device receiver circuitry, and the high-bandwidth communication link 150 to remain in an ACTIVE mode.

In embodiments, the source device 110 may include a system-on-chip (SoC) or similar semiconductor devices. In embodiments, the source device 110 includes at least the memory circuitry 130 and the control circuitry 140 communicatively coupled to the memory circuitry 130. The memory circuitry 130 may include any number and/or combination of volatile and/or non-volatile storage devices. Example volatile storage devices include but are not limited to: dynamic random access memory (DRAM) and static random access memory (SRAM). Example non-volatile storage devices include but are not limited to: read-only memory (ROM), flash memory, and ferroelectric random access memory. The memory circuitry 130 may have any size, capacity, and/or physical configuration. In embodiments, the memory circuitry 130 stores bulk data 120 generated by the source device 110 until such time as the source control circuitry 140 causes the transfer of the bulk data 120 to the sink device 160.

The source control circuitry 140 may include one or more graphics processor circuits, graphics processing units, or similar In embodiments, the source control circuitry 140 may include one or more DisplayPort (DP) control circuits. In operation, the source control circuitry 140 may determine whether to enable a Panel Self-Refresh (PSR) mode in a communicatively coupled sink/display device 160. In response to enabling a PSR mode, the source control circuitry 140 may determine whether bulk data 120 is stored, held, or otherwise retained in the memory circuitry 130. If bulk data 120 is present in the memory circuitry 130, the source control circuitry 140 causes the source transmitter circuitry, the sink receiver circuitry, and the high-bandwidth communications link 150 to remain active. The source control circuitry 140 then generates one or more data transport units (DTUs) 122A-122n to convey the bulk data 120 from the source memory circuitry 130 to sink memory circuitry 180. In embodiments, the first DTU 122A communicated by the source control circuitry 140 to the sink control circuitry 170 includes a header portion containing one or more data fields. In embodiments, a first of the one or more data fields includes data indicative of a subsequent transfer of bulk data 120 to the sink memory circuitry 180. In embodiments, a second of the one or more DTU header data fields includes data indicating the bulk data 120 is "non-display" type data for storage in the sink/display device memory circuitry 180 and the sink/display device 160 should continue to display a stored image contemporaneous with at least a portion of the transfer of the bulk data 120 from the source memory circuitry 130 to the sink memory circuitry 180. In embodiments, the header associated with each of the DTUs 122 used to transport the bulk data 122 includes a data field indicating the bulk data 120 is "non-display" type data. In embodiments, the source control circuitry 140 maintains an ENABLED PSR mode until the transfer of the bulk data 120 from the source memory circuitry 130 to the sink memory circuitry 180 is complete.

Upon completion of the transfer of the bulk data 120 from the source memory circuitry 130 to the sink memory circuitry 180, the source control circuitry 140 determines whether to ENABLE or DISABLE PSR mode. If the source control circuitry 140 determines to maintain PSR mode in an ENABLED state, the source control circuitry 140 may cause the sink device 160 to continue to display data representative of one or more stored images and disable the source transmitter circuitry, sink receiver circuitry, and high-bandwidth interconnect 150. If the source control circuitry 140 instead determines to DISABLE the PSR mode, the source control circuitry 140 commences the transfer of new display images to the sink/display device 160.

Referring next to FIG. 1B, the source control circuitry 140 has completed the transfer of the bulk data 120 from the source memory circuitry 130 to the sink memory circuitry 180. In embodiments, the source control circuitry 140 may retain all or a portion of the bulk data 120 in the source memory circuitry 130 after successfully transferring the bulk data 120 to the sink/display memory circuitry 180. In embodiments, the source control circuitry 140 may delete or otherwise remove the bulk data 120 from the source device memory circuitry 130.

In embodiments, the sink device 160 may include any device capable of receiving bulk data 120 generated by the source device 110. In embodiments, the sink device 160 may include an organic light emitting diode (OLED) display device having any size, physical geometry, and/or resolution. In embodiments, the source device 110 may include one or more devices capable of generating an output signal that includes information and/or data for display by an OLED display sink device 160.

The sink device control circuitry 170 may include any number and/or combination of systems or devices capable of controlling the operation of the sink device 160. In embodiments, the sink device control circuitry 170 may include one or more timing control (TCON) circuits. In embodiments, the sink memory circuitry 180 may be disposed, in whole or in part, in, on, or about the sink device 160. In embodiments, the sink memory circuitry 180 may include frame buffer circuitry and a first portion of the frame buffer circuitry may store or otherwise retain at least one image data frame and a second portion of the frame buffer circuitry may provide a storage location for the bulk data 120 received from the source device 110.

Figure 2A:
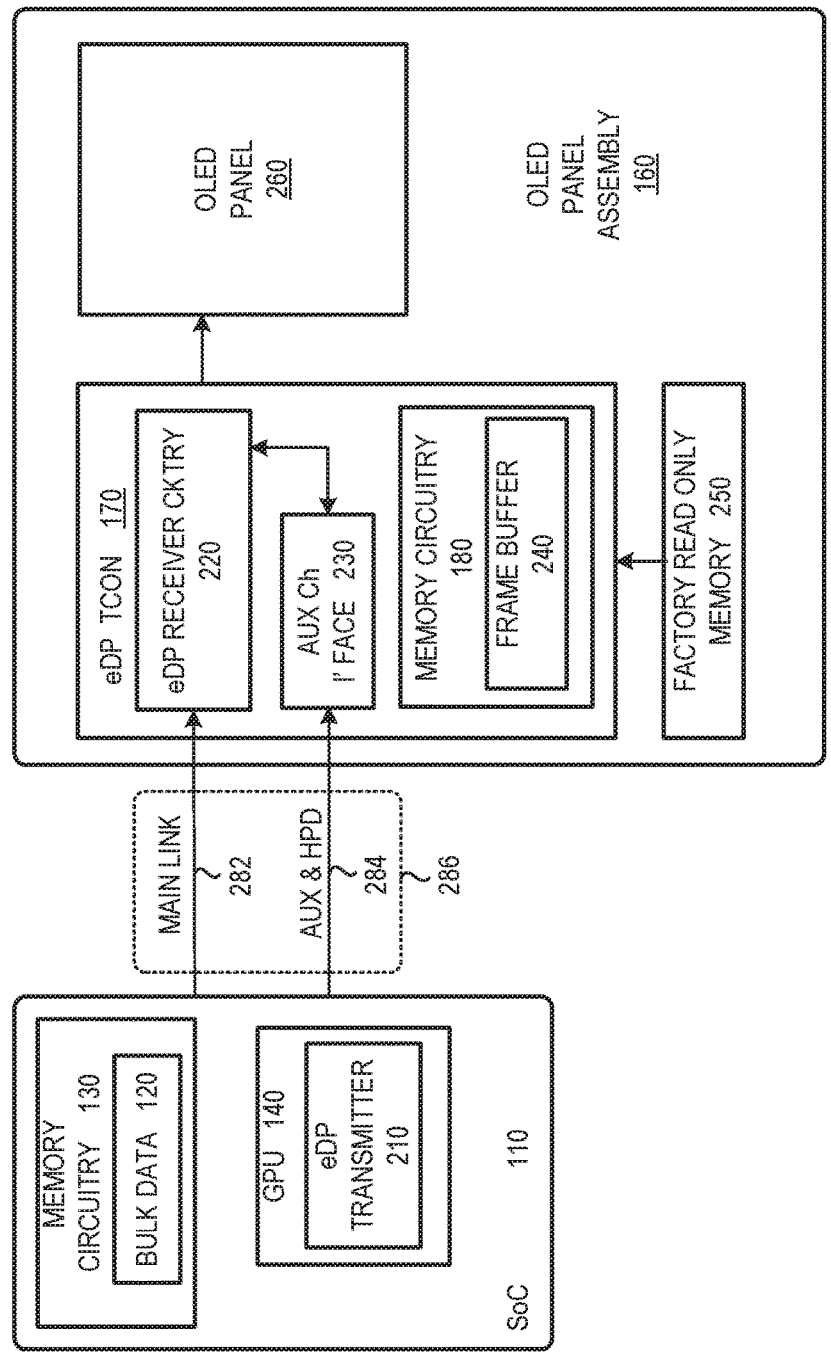
FIG. 2A is a schematic diagram of an illustrative system for transferring bulk data from a source device, such as a system-on-chip (SoC), to a sink device, such as an OLED display device, via a high-bandwidth DisplayPort communications link, in accordance with at least one embodiment described herein.
Figure 2B:
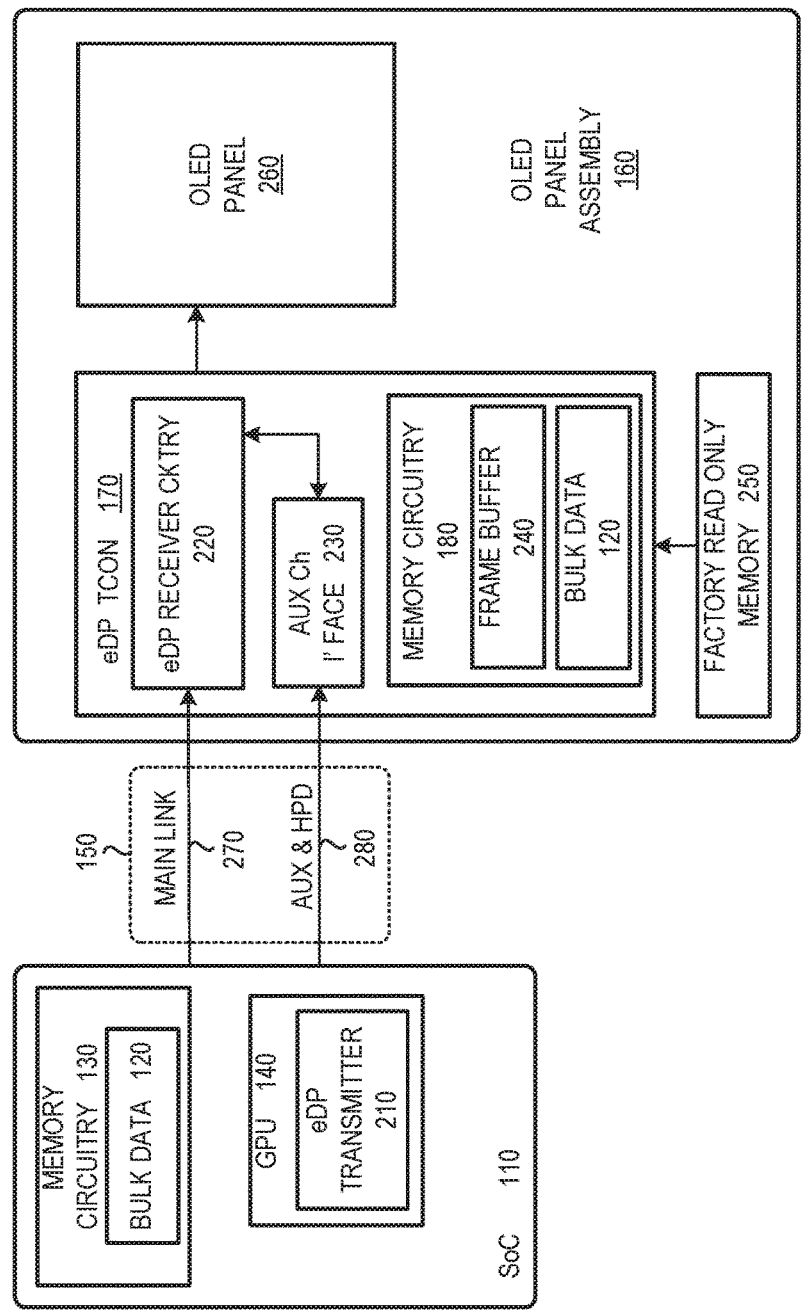
FIG. 2B is a schematic diagram of the illustrative system depicted in FIG. 2A after completion of the transfer of bulk data from the SoC to the OLED display device, in accordance with at least one embodiment described herein.

FIG. 2A is a schematic diagram of an illustrative system 200 for transferring bulk data 120 from a source device 110, such as a system-on-chip (SoC), to a sink device 160, such as an OLED display device, via a high-bandwidth DisplayPort communications link 150, in accordance with at least one embodiment described herein. FIG. 2B is a schematic diagram of the illustrative system 200 depicted in FIG. 2A after completion of the transfer of bulk data 120 from the SoC 110 to the OLED display device 160, in accordance with at least one embodiment described herein. As depicted in FIGS. 2A and 2B, the source device may include an SoC 110 that includes at least memory circuitry 130 in which the bulk data 120 is stored or otherwise retained and control circuitry 140, such as a graphics processing unit (GPU) that includes source transmitter circuitry 210, such as embedded DisplayPort (eDP) transmitter circuitry. The sink device 160 may include an OLED display device that includes sink control circuitry 170, such as eDP timing control circuitry (TCON). The eDP TCON 170 includes at least the sink memory circuitry 180 and sink receiver circuitry 220, such as eDP receiver circuitry. As depicted in FIGS. 2A and 2B, a high-bandwidth communications link 150, such as a DisplayPort communications link that includes at least a multi-lane communications link 270 and a sideband link 284 communicatively couples the SoC 110 to the OLED display device 160.

As depicted in FIG. 2A, the eDP TCON circuitry 170 contained in the OLED Panel Assembly 160 includes one or more auxiliary channel interfaces 230 to support relatively low bandwidth sideband communication between the SoC 110 and the OLED Panel Assembly 160. In embodiments, the sink memory circuitry 180 may include a first memory portion that provides frame buffer circuitry to store information and/or data representative of one or more images for display by the OLED Panel 260. Referring to FIG. 2B, the memory circuitry 180 may include a second portion to store bulk data 120 transferred from the source memory circuitry 130. The OLED panel assembly 160 may also include one or more factory Read Only Memory (FROM) circuits 250 to store information and/or data such as configuration settings and the like associated with the OLED Panel Assembly 160.

The source transmitter circuitry 210 includes any number and/or combination of currently available and/or future developed electronic components, semiconductor devices, optical elements, and/or logic elements capable of performing relatively high-bandwidth, multi-lane, bi-directional, communication between the SoC 110 and the OLED panel assembly 160. As depicted in FIGS. 2A and 2B, the source transmitter circuitry 210 may include components such as eDP interfaces and instruction sets that use and are compliant with the DisplayPort protocol (e.g., DisplayPort Ver. 1.4, or most current revision, as adopted by the Video Electronics Standards Association).

The sink receiver circuitry 220 may include any number and/or combination of currently available and/or future developed electronic components, semiconductor devices, optical elements, and/or logic elements capable of performing relatively high-bandwidth, multi-lane, bi-directional, communication between the source device 110 and the sink device 160. As depicted in FIGS. 2A and 2B, the sink receiver circuitry 220 may include components such as eDP interfaces and instruction sets that use and are compliant with the DisplayPort protocol (e.g., DisplayPort Ver. 1.4, or most current revision, as adopted by the Video Electronics Standards Association).

The auxiliary channel interface circuitry 230 may include any number and/or combination of currently available and/or future developed electronic components, semiconductor devices, optical elements, and/or logic elements capable of performing relatively low-bandwidth, bi-directional, communication via one or more communication links 280 between the source device 110 and the sink device 160. As depicted in FIGS. 2A and 2B, the auxiliary channel interface circuitry 230 may include components such as eDP interfaces and instruction sets that use and are compliant with the DisplayPort protocol (e.g., DisplayPort Ver. 1.4, or most current revision, as adopted by the Video Electronics Standards Association).

A first portion of the sink memory circuitry 180 may provide the frame buffer memory circuitry 240. The frame buffer memory circuitry 240 stores or otherwise retains information and/or data representative of one or more images for display on the OLED panel 260. When PSR mode is ENABLED, the OLED panel assembly 160 will display the image data stored in the frame buffer memory circuitry 240. The OLED display memory circuitry 180 may have any size or storage capacity. For example, the OLED display memory circuitry 180 may have a total storage capacity of about: 64 MB or less; 128 MB or less; 256 MB or less; 512 MB or less; 16 gigabytes (GB) or less; 32 GB or less; 64 GB or less; or 128 GB or less. The first portion of the sink memory circuitry 180 may have any size or storage capacity. For example, the first portion of the sink memory circuitry 180 may have a storage capacity of about: 1 megabyte (MB) or less; 2 MB or less; 4 MB or less; 8 MB or less; 12 MB or less; 16 MB or less; or 20 MB or less. The second portion of the OLED display memory circuitry 180 used to store all or a portion of the bulk data 120 transferred from the SoC 110 may have any size or storage capacity. For example, the second portion of the OLED display memory circuitry 180 may have a storage capacity of about: 16 megabytes (MB) or less; 32 MB or less; 64 MB or less; 128 MB or less; 256 MB or less; 512 MB or less; 8 gigabytes (GB) or less; 32 GB or less; or 64 GB or less.

The factory read only memory (FROM) circuitry 250 may include any number and/or combination of currently available and/or future developed electronic components, semiconductor devices, optical elements, and/or logic elements capable of storing various configuration settings for the OLED panel assembly. In embodiments, all or a portion of the FROM circuitry 250 may include re-writeable ROM (e.g., EEPROM or similar).

The OLED panel 260 may include any number and/or combination of currently available and/or future developed electronic components, semiconductor devices, optical elements, and/or logic elements capable of displaying an image by providing a respective controlled voltage signal to each of a plurality of organic light emitting diode (OLED) picture elements/pixels. The OLED panel 260 may have any physical size, resolution, and/or display area. In embodiments, the OLED panel 260 may be incorporated into a unitary device, such as a smartphone, a portable computing device, a handheld computing device, a wearable computing device or similar. In embodiments all or a portion of the bulk data 120 may include OLED compensation information and/or data to accommodate changes in intensity, brightness, and/or color gamut of individual OLED pixels within the OLED panel 260 over the life of the OLED panel 260.

Figure 3:
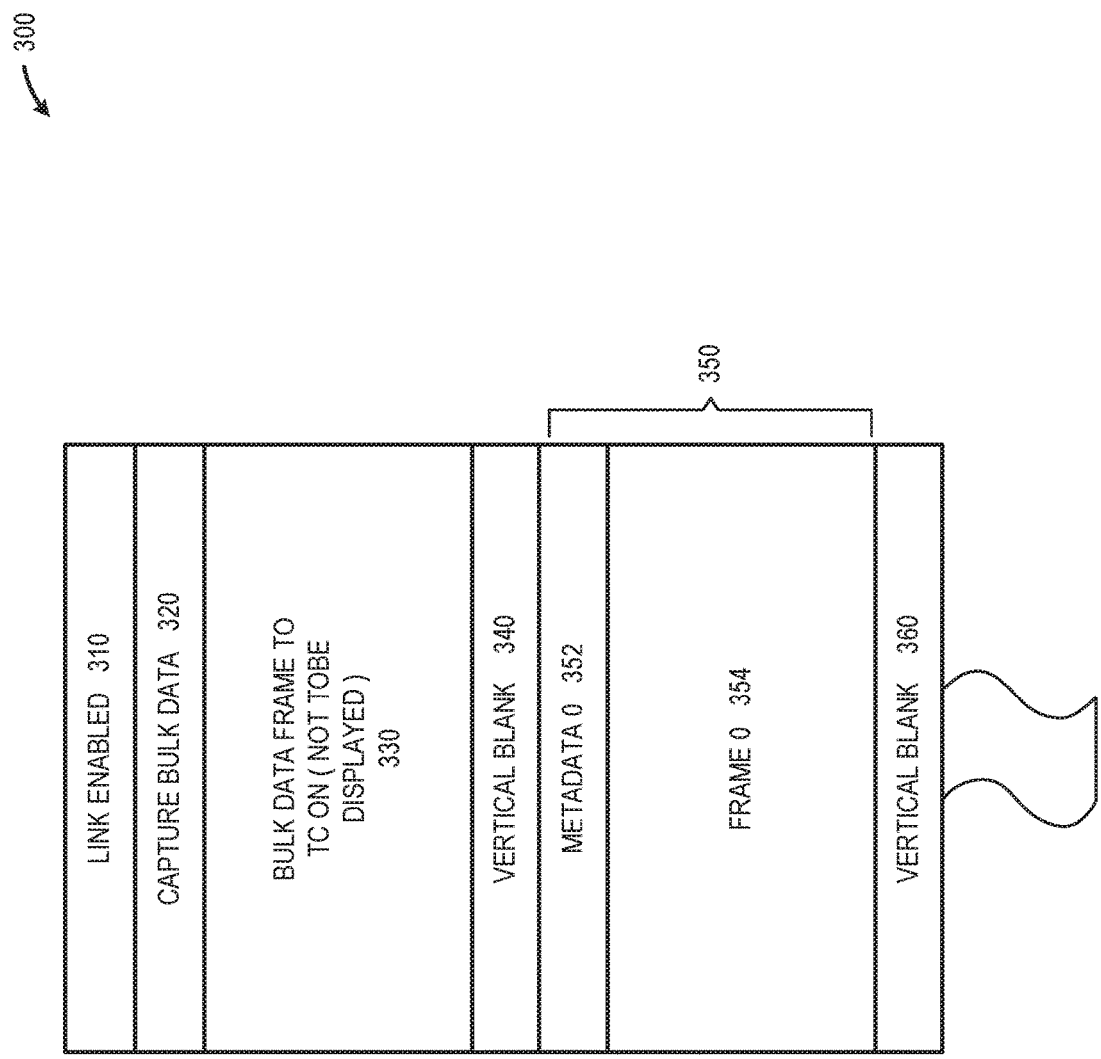
FIG. 3 depicts a communications link establishment process between a source device, such as an SoC, and a sink device, such as an OLED panel assembly, in accordance with at least one embodiment described herein.

FIG. 3 depicts a communications link establishment process 300 between a source device 110, such as an SoC, and a sink device 160, such as an OLED panel assembly 160, in accordance with at least one embodiment described herein. As depicted in FIG. 3, at 310, the source control circuitry 140 establishes the communications link (e.g., a DisplayPort link) between the source device 110 and the sink device 160. At 320, upon establishment of the communications link 310, the source control circuitry 140 captures all or a portion of the bulk data 120 generated or otherwise determined by the source device 110. Such bulk data 120 may include but is not limited to 3DLUT or OLED compensation mask data.

At 330, the source control circuitry 140 communicates the bulk data 120 to the sink device control circuitry 170. The source control circuitry 140 designates the frames containing the bulk data 120 as containing "NON-DISPLAY" data. In embodiments, the header data accompanying each frame may include one or more fields containing information and/or data indicative of the "NON-DISPLAY" nature of the bulk data carried by the respective frame. In embodiments, the header data accompanying each frame may include one or more fields containing information and/or data that causes the sink control circuitry 170 to store the received bulk data 120 in the second portion of the sink device memory circuitry 180.

At 340, upon completion of the bulk data transfer, the source control circuitry 140 communicates a vertical blank to the sink device 160. At 350, the source control circuitry 140 communicates an image data frame, including metadata ("METADATA 0") and frame data ("FRAME 0") to the sink device 160. After transmitting FRAME 0 data, the source control circuitry 140 communicates a vertical blank 360 to the sink device 160.

Figure 4:
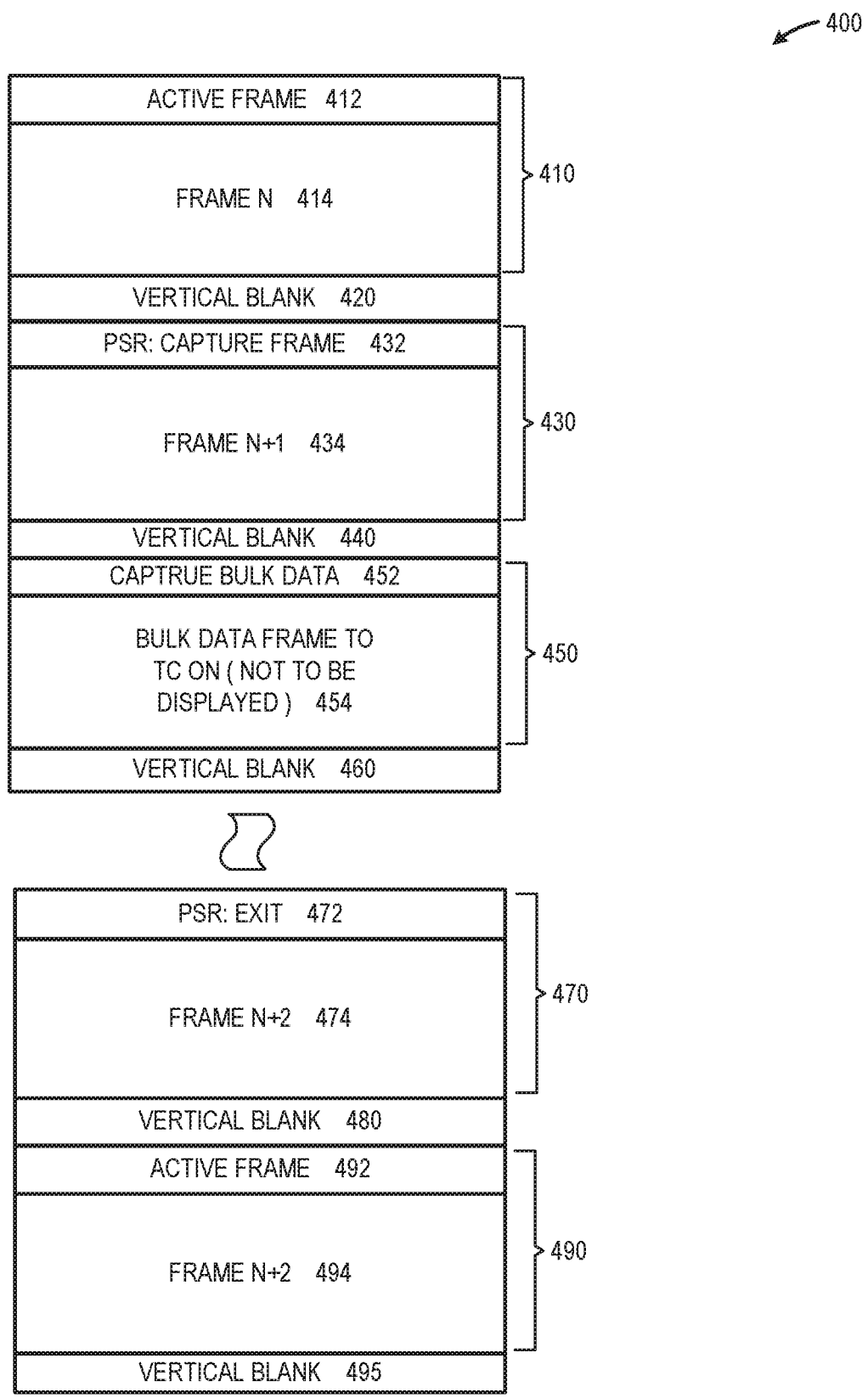
FIG. 4 depicts a communications link establishment process between a source device, such as an SoC, and a sink device, such as an OLED panel assembly, in accordance with at least one embodiment described herein.

FIG. 4 depicts a communications link establishment process 400 between a source device 110, such as an SoC, and a sink device 160, such as an OLED panel assembly 160, in accordance with at least one embodiment described herein. As depicted in FIG. 4, at 410, the source control circuitry 140 communicates the "Nth" DTU 122N to the sink device 160. DTU 122N includes a header 412 and image data 414. After transmitting DTU 122N to the sink device 160, at 420 the source control circuitry 140 communicates a vertical blank to the sink device 160.

At 430, the source control circuitry 140 generates and communicates the "N+1st" DTU $122_{N+1}$ for communication to the sink device 160. DTU $122_{N+1}$ includes a header 432 and image data 434. The frame header 432 includes one or more fields that include information and/or data indicative of ENABLING a PSR mode. The source control circuitry 110 notifies the sink device 160 of the ENABLED PSR mode, and the sink device stores or otherwise retains image data 434 in the frame buffer memory circuitry 240 and refreshes the display device 260 with image data 434 while the PSR mode remains ENABLED. After transmitting DTU $122_{N+1}$ to the sink device 160, at 440 the source control circuitry 140 communicates a vertical blank to the sink device 160.

At 450, the source control circuitry 140 communicates one or more DTUs 122 containing bulk data 120 to the sink device control circuitry 170. The source control circuitry 140 designates the DTUs 122 containing the bulk data 120 as containing "NON-DISPLAY" data. In embodiments, the header 452 accompanying each of the DTUs 122 may include one or more fields containing information and/or data indicative of the "NON-DISPLAY" nature of the bulk data 120 carried by the respective DTU 122. In embodiments, the header 452 accompanying each DTU 122 may include one or more fields containing information and/or data that causes the sink control circuitry 170 to store the received bulk data 120 in the second portion of the sink device memory circuitry 180. At 460, upon completion of the bulk data transfer, the source control circuitry 140 communicates a vertical blank to the sink device 160. While PSR mode remains ENABLED, the sink device 160 continues to display the image data stored in the frame buffer circuitry 240.

At 470, the source control circuitry 140 generates and communicates the "N+2nd" DTU 122 to the sink device 160. The "N+2nd" DTU 122 includes a header 472 and image data 474. The header 472 includes one or more fields that include information and/or data indicative of DISABLING or exiting PSR mode. The sink device 160 stores the "N+2nd" image data 474 in the frame buffer memory circuitry 240. After transmitting the "N+2nd" DTU 122 to the sink device 160, at 480 the source control circuitry 140 communicates a vertical blank to the sink device 160.

At 490, the source control circuitry 140 generates and communicates the "N+2nd" DTU $122_{N+2}$ to the sink device 160. DTU $122_{N+2}$ includes a header 492 and image data 494. After transmitting DTU $122_{N+2}$ to the sink device 160, at 496 the source control circuitry 140 communicates a vertical blank to the sink device 160.

Figure 5:
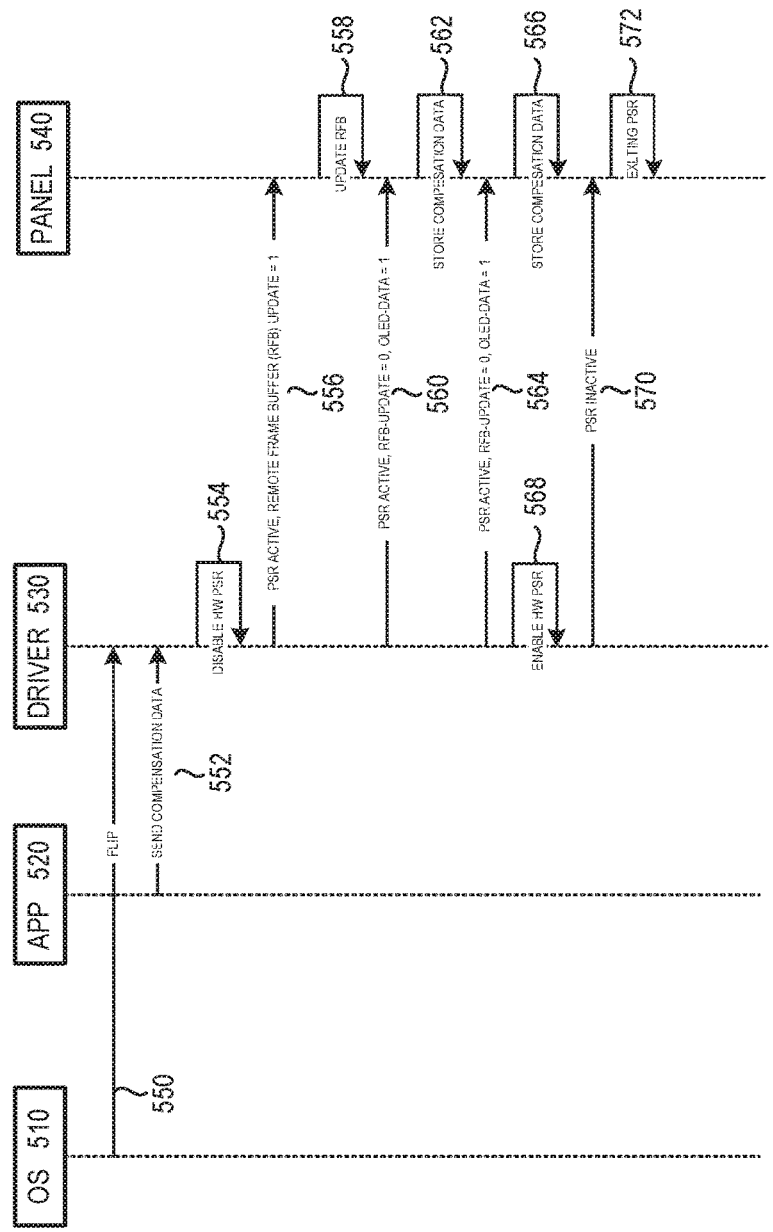
FIG. 5 is a timing diagram of an illustrative bulk data transfer during a PSR mode, in accordance with at least one embodiment described herein.

FIG. 5 is a timing diagram 500 of an illustrative bulk data transfer during a PSR mode, in accordance with at least one embodiment described herein. FIG. 5 depicts an example event sequence between an operating system (O/S) 510 executing on a host system, an application 520 executing on a host system, a source control circuit (e.g., a device driver circuit) 530, and a sink device (e.g., an OLED panel assembly) 540.

At 550, the O/S 510 provides an indication to the source control circuit 530 that includes information and/or data associated with a new image for display by the sink device 540.

At 552, an application 520 executed by the source device 110 generates bulk data 120, such as OLED compensation mask data, and communicates the bulk data 120 to at least one of the source memory circuitry 130 and/or the source control circuit 530.

At 554, in preparation for the transfer of the bulk data 120, the source control circuit 530 disables hardware PSR mode. In hardware PSR mode, the source transmitter circuitry 210, the sink receiver circuitry 220, and the high-bandwidth communications link 150 are disabled while the sink device refreshes using image data stored or otherwise retained in the frame buffer memory circuitry 240. If the source transmitter circuitry 210, the sink receiver circuitry 220, and the high-bandwidth communications link 150 are disabled by the hardware PSR mode, the transfer of DTUs 122 containing all or a portion of the bulk data 120 cannot occur over the high-bandwidth communications link 150, thus, the source control circuitry disables the hardware PSR mode.

At 556, the source control circuitry 530 communicates DTU $122_1$ containing image data to the sink device 540. The header associated with the DTU $122_1$ includes one or more fields including information indicative of a modified PSR mode in which the source transmitter circuitry 210, the sink receiver circuitry 220, and the high-bandwidth communications link 150 remain ENABLED while the sink device 540 captures and displays the image data included in the data portion of DTU $122_1$ and remains in PSR mode.

At 558, the sink device 540 updates the frame buffer memory circuitry 240 with the image data received at 556.

At 560, the source control circuit 530 communicates DTU $122_2$ containing bulk data (e.g., OLED compensation mask data) to the sink device 540. In embodiments, DTU $122_2$ includes a header that contains one or more fields containing information and/or data indicative of the ENABLED modified PSR mode. In embodiments, DTU $122_2$ includes a header that contains one or more fields containing information and/or data indicative that the bulk data includes NON-DISPLAY data that should be stored in the second portion of the sink memory circuitry 180.

At 562, the sink device 540 stores the bulk data 120 received at 560 in the second portion of the sink memory circuitry 180.

At 564, the source control circuit 530 generates and communicates DTU $122_3$ containing bulk data 120 (e.g., OLED compensation mask data) to the sink device 540. In embodiments, DTU $122_3$ includes a header that contains one or more fields containing information and/or data indicative of the ENABLED modified PSR mode. In embodiments, DTU $122_3$ includes a header that contains one or more fields containing information and/or data indicative that the bulk data includes NON-DISPLAY data that should be stored in the second portion of the sink memory circuitry 180.

At 566, the sink device 540 stores the bulk data 120 received at 560 in the second portion of the sink memory circuitry 180.

At 568, contemporaneous with the storage of the bulk data 120 in the second portion of the sink memory circuitry 180, the source control circuit 530 DISABLES the modified PSR mode and re-enables hardware PSR mode. By re-enabling hardware PSR mode, the source transmitter circuitry 210, the sink receiver circuitry 220, and the high-bandwidth communications link 150 are DISABLED, reducing the power consumption of the source device 110.

At 570, the source control circuit 530 DISABLES the hardware PSR mode.

At 572, the sink device 540 exits the hardware PSR mode, placing the source transmitter circuitry 210, the sink receiver circuitry 220, and the high-bandwidth communications link 150 in an ENABLED state.

Figure 6:
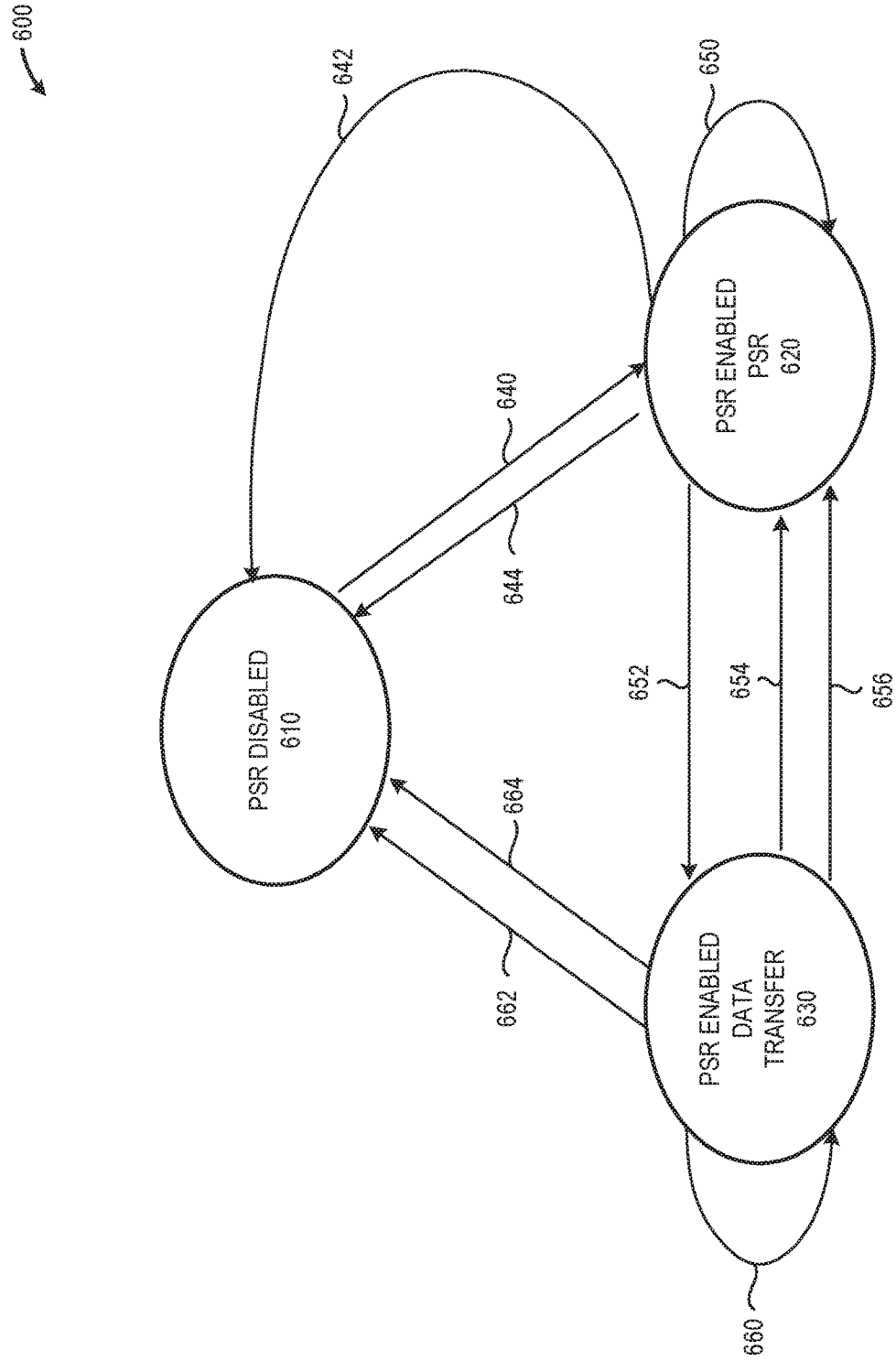
FIG. 6 is a state diagram depicting events causing system state changes between a PSR DISABLED state, a PSR ENABLED state, and a PSR ENABLED+DATA TRANSFER state, in accordance with at least one embodiment described herein.

FIG. 6 is a state diagram 600 depicting events causing system state changes between a PSR DISABLED 610 state, a PSR ENABLED 620 state, and a PSR ENABLED+DATA TRANSFER state 630, in accordance with at least one embodiment described herein. As depicted in FIG. 6, at 640, the PSR DISABLED state 610 transitions to the PSR ENABLED state 620 in response to an out-of-cycle or scheduled transition from the PSR DISABLED state 610 to the PSR ENABLED state 620. At 642, the PSR ENABLED state 620 transitions to the PSR DISABLED state 610 upon the completion of a bulk data transfer between a source device 110 and a sink device 160 and upon receipt of an active DTU 122 by the source communication circuitry 140. At 644, the PSR ENABLED state 620 also transitions to the PSR DISABLED state 610 upon an abort of the transfer of bulk data from the source device 110 to the sink device 160.

At 650 the PSR ENABLED state 620 is maintained while bulk data 120 is updated or stored in the sink device memory circuitry 180. At 652, the PSR ENABLED state 620 transitions to the PSR ENABLED+DATA TRANSFER state 630 in response to an initiation or resumption of transfer of bulk data 120 via one or more DTUs 122 from the source device 110 to the sink device 160. At 654, the PSR ENABLED+ DATA TRANSFER state 630 transitions to the PSR ENABLED state 620 in response to a transfer of bulk data 120 from the source device memory circuitry 130 to the source device communications circuitry 210. AT 656, the PSR ENABLED+DATA TRANSFER state 630 transitions to the PSR ENABLED state 620 in response to the completion of a transfer of a DTU 122 and with no pending active DTU to communicate from the source device 110 to the sink device 160.

At 660, the PSR ENABLED+DATA TRANSFER state 630 is maintained while the source device 110 transfers one or more DTUs 122 to the sink device 160. At 662, the PSR ENABLED+DATA TRANSFER state 630 transitions to the PSR DISABLED state 610 in response to the completion of the bulk data transfer from the source device 110 to the sink device 160 and the presence of a DTU 122 containing active image data pending transfer from the source device 110 to the sink device 160. At 664, the PSR ENABLED+DATA TRANSFER state 630 transitions to the PSR DISABLED state 610 in response to abandonment of the bulk data transfer from the source device 110 to the sink device 160.

Figure 7:
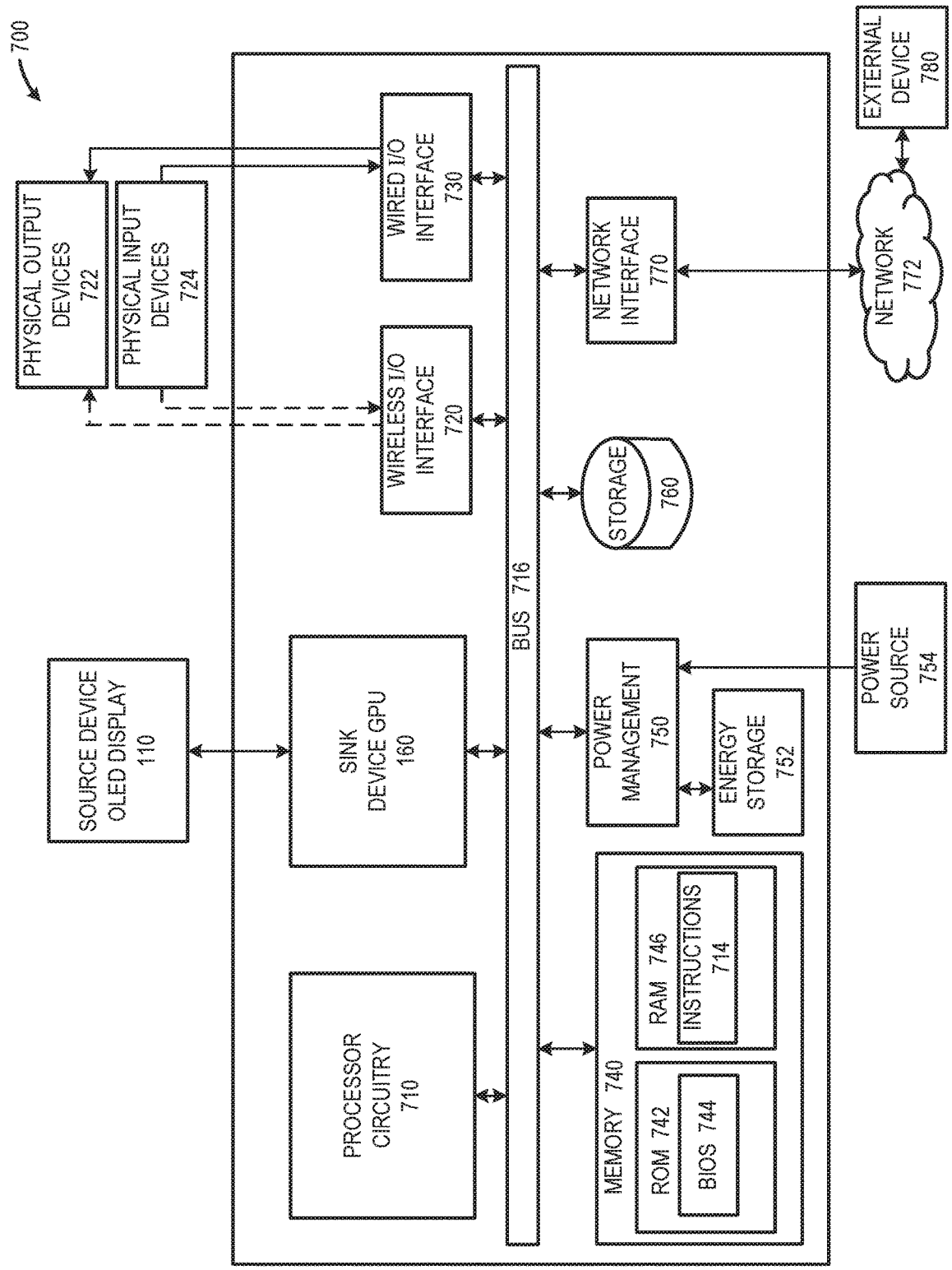
FIG. 7 is a schematic diagram of an illustrative electronic, processor-based, device that includes a graphics processing unit ("GPU")/source device and an OLED display/sink device, in accordance with at least one embodiment described herein.

FIG. 7 is a schematic diagram of an illustrative electronic, processor-based, device 700 that includes a graphics processing unit ("GPU")/source device 110 and an OLED display/sink device 160, in accordance with at least one embodiment described herein. The processor-based device 700 may additionally include one or more of the following: processor circuitry 710, a wireless input/output (I/O) interface 720, a wired I/O interface 730, system memory 740, power management circuitry 750, a non-transitory storage device 760, and a network interface 770. The following discussion provides a brief, general description of the components forming the illustrative processor-based device 700. Example, non-limiting processor-based devices 700 may include, but are not limited to: smartphones, wearable computers, portable computing devices, handheld computing devices, desktop computing devices, blade server devices, workstations, and similar.

In some embodiments, the processor-based device 700 includes processor circuitry 710 capable of executing machine-readable instruction sets and generating an output signal capable of providing a display output to a system user via the OLED display 160. Those skilled in the relevant art will appreciate that the illustrated embodiments as well as other embodiments may be practiced with other processor-based device configurations, including portable electronic or handheld electronic devices, for instance smartphones, portable computers, wearable computers, consumer electronics, personal computers ("PCs"), network PCs, minicomputers, server blades, mainframe computers, and the like. The processor circuitry 710 may include any number of hard-wired or configurable circuits, some or all of which may include programmable and/or configurable combinations of electronic components, semiconductor devices, and/or logic elements that are disposed partially or wholly in a PC, server, or other computing system capable of executing machine-readable instructions.

The processor-based device 700 includes a bus or similar communications link 716 that communicably couples and facilitates the exchange of information and/or data between various system components including the processor circuitry 710, the GPU circuitry 160, one or more wireless I/O interfaces 720, one or more wired I/O interfaces 730, the system memory 740, the power management circuitry 750, one or more storage devices 760, and/or one or more network interfaces 770. The processor-based device 700 may be referred to in the singular herein, but this is not intended to limit the embodiments to a single processor-based device 700, since in certain embodiments, there may be more than one processor-based device 700 that incorporates, includes, or contains any number of communicably coupled, collocated, or remote networked circuits or devices.

The processor circuitry 710 may include any number, type, or combination of currently available or future developed devices capable of executing machine-readable instruction sets. The processor circuitry 710 may include but is not limited to any current or future developed single- or multi-core processor or microprocessor, such as: on or more systems on a chip (SOCs); central processing units (CPUs); digital signal processors (DSPs); graphics processing units (GPUs); application-specific integrated circuits (ASICs), programmable logic units, field programmable gate arrays (FPGAs), and the like. Unless described otherwise, the construction and operation of the various blocks shown in FIG. 7 are of conventional design. Consequently, such blocks need not be described in further detail herein, as they will be understood by those skilled in the relevant art. The bus 716 that interconnects at least some of the components of the processor-based device 700 may employ any currently available or future developed serial or parallel bus structures or architectures.

The system memory 740 may include read-only memory ("ROM") 742 and random access memory ("RAM") 746. A portion of the ROM 742 may be used to store or otherwise retain a basic input/output system ("BIOS") 744. The BIOS 744 provides basic functionality to the processor-based device 700, for example by causing the processor circuitry 710 to load and/or execute one or more machine-readable instruction sets, such as the operating system instructions, and/or one or more applications. In embodiments, at least some of the one or more machine-readable instruction sets cause at least a portion of the processor circuitry 710 to provide, create, produce, transition, and/or function as a dedicated, specific, and particular machine, for example a word processing machine, a digital image acquisition machine, a media playing machine, a gaming system, a communications device, a smartphone, or similar.

The processor-based device 200 may include at least one wireless input/output (I/O) interface 720. The at least one wireless I/O interface 720 may be communicably coupled to one or more physical output devices 722 (tactile devices, video displays, audio output devices, hardcopy output devices, etc.). The at least one wireless I/O interface 720 may communicably couple to one or more physical input devices 724 (pointing devices, touchscreens, keyboards, tactile devices, etc.). The at least one wireless I/O interface 720 may include any currently available or future developed wireless I/O interface. Example wireless I/O interfaces include, but are not limited to: BLUETOOTH®, near field communication (NFC), and similar The processor-based device 700 may include one or more wired input/output (I/O) interfaces 730. The at least one wired I/O interface 730 may be communicably coupled to one or more physical output devices 722 (tactile devices, video displays, audio output devices, hardcopy output devices, etc.). The at least one wired I/O interface 730 may be communicably coupled to one or more physical input devices 724 (pointing devices, touchscreens, keyboards, tactile devices, etc.). The wired I/O interface 730 may include any currently available or future developed I/O interface. Example wired I/O interfaces include but are not limited to: universal serial bus (USB), IEEE 1394 ("FireWire"), and similar.

The processor-based device 700 may include one or more communicably coupled, non-transitory, data storage devices 760. The data storage devices 760 may include one or more hard disk drives (HDDs) and/or one or more solid-state storage devices (SSDs). The one or more data storage devices 760 may include any current or future developed storage appliances, network storage devices, and/or systems. Non-limiting examples of such data storage devices 760 may include, but are not limited to, any current or future developed non-transitory storage appliances or devices, such as one or more magnetic storage devices, one or more optical storage devices, one or more electro-resistive storage devices, one or more molecular storage devices, one or more quantum storage devices, or various combinations thereof. In some implementations, the one or more data storage devices 760 may include one or more removable storage devices, such as one or more flash drives, flash memories, flash storage units, or similar appliances or devices capable of communicable coupling to and decoupling from the processor-based device 200.

The one or more data storage devices 760 may include interfaces or controllers (not shown) communicatively coupling the respective storage device or system to the bus 716. The one or more data storage devices 760 may store, retain, or otherwise contain machine-readable instruction sets, data structures, program modules, data stores, databases, logical structures, and/or other data useful to the processor circuitry 710 and/or GPU circuitry 110 and/or one or more applications executed on or by the processor circuitry 710 and/or GPU circuitry 110. In some instances, one or more data storage devices 760 may be communicably coupled to the processor circuitry 150, for example via the bus 716 or via one or more wired communications interfaces 730 (e.g., Universal Serial Bus or USB); one or more wireless communications interfaces 720 (e.g., Bluetooth®, Near Field Communication or NFC); and/or one or more network interfaces 270 (IEEE 802.3 or Ethernet, IEEE 802.11, or WiFi®, etc.).

The one or more data storage devices 760 stores all or a portion of the instructions executed, at least in part, by the processor circuitry 710. The one or more data storage devices 104 may store, include, or otherwise retain operating system instructions. The operating system instructions may include but are not limited to any version up to the latest release of: Windows®; OSx®; Android®; Linux®; and similar. The one or more storage devices 760 may store, include, or otherwise retain application instructions executed by the processor circuitry 710. Such applications may include but are not limited to: productivity software; communications software; entertainment software; audio and/or video playback software; or similar.

The processor-based device 700 may include power management circuitry 750 that controls one or more operational aspects of the energy storage device 752. In embodiments, the energy storage device 752 may include one or more primary (i.e., non-rechargeable) or secondary (i.e., rechargeable) batteries or similar energy storage devices. In embodiments, the energy storage device 752 may include one or more supercapacitors or ultracapacitors. In embodiments, the power management circuitry 750 may alter, adjust, or control the flow of energy from an external power source 754 to the energy storage device 752 and/or to the processor-based device 700. The power source 754 may include, but is not limited to, a solar power system, a commercial electric grid, a portable generator, an external energy storage device, or any combination thereof.

For convenience, the processor circuitry 710, the storage device 760, the system memory 740, the GPU circuitry 110, the wireless I/O interface 720, the wired I/O interface 730, the power management circuitry 750, and the network interface 770 are illustrated as communicatively coupled to each other via the bus 716, thereby providing connectivity between the above-described components. In alternative embodiments, the above-described components may be communicatively coupled in a different manner than illustrated in FIG. 7. For example, one or more of the above-described components may be directly coupled to other components, or may be coupled to each other, via one or more intermediary components (not shown). In another example, one or more of the above-described components may be integrated into the processor circuitry 710 and/or the graphics processor circuitry 712. In some embodiments, all or a portion of the bus 716 may be omitted and the components are coupled directly to each other using suitable wired or wireless connections.

FIG. 8 is an example header portion 800 associated with an illustrative DTU 122 communicated from the source transmitter circuitry 210 to the sink receiver circuitry 220 contemporaneous with the source control circuitry 140 ENABLING PSR mode in the sink device 160, in accordance with at least one embodiment described herein. As depicted in FIG. 8, header byte two ("HB2") includes a 5-bit sequence 802 to provide an indication of the revision number of the data type included in the data portion of the DTU 122. As depicted in FIG. 8, HB2 includes a bit sequence to identify the DTU 122 as a PSR bulk data transfer. Also as depicted in FIG. 8, header byte 3 ("HB3") includes a 5-bit data validity value associated with the transfer of bulk data from the source device 110 to the sink device 160.

FIG. 9A is a first portion (data byte 0 through data byte 7) of an example header portion 900 associated with an illustrative DTU 122 communicated from the source transmitter circuitry 210 to the sink receiver circuitry 220 contemporaneous with the source control circuitry 140 ENABLING PSR mode in the sink device 160, in accordance with at least one embodiment described herein. FIG. 9B is a first portion (data byte 8 through data byte 13) of the example header portion 900 associated with the illustrative DTU 122 communicated from the source transmitter circuitry 210 to the sink receiver circuitry 220 contemporaneous with the source control circuitry 140 ENABLING PSR mode in the sink device 160, in accordance with at least one embodiment described herein. As depicted in FIG. 9A, a bit 910 included in data byte 1 may be used to indicate the type of data (VIDEO/NON-VIDEO) carried by the respective DTU 122.

FIG. 9B includes a number of extension bytes that associated with the transfer of bulk data 120 contemporaneous with an ENABLED PSR mode. Data byte eight ("DB8") 920 includes two bits indicating whether the payload bulk data includes panel firmware or OLED compensation data. Data byte nine ("DB9") 930 includes two bits indicative of a bulk data transfer status, two bits indicative of a sequence number associated with the data payload carried by the respective DTU 122, and four reserved bits. Data byte ten (DB10) includes 8 bits indicative of the size of a non-video bulk data payload carried by the respective DTU 122. Data byte eleven (DB11) includes an additional 8 bits indicative of the size of the non-video bulk data payload carried by the respective DTU 122. Data byte twelve (DB12) includes an additional 8 bits indicative of the size of the non-video bulk data payload carried by the respective DTU 122.

Figure 10:
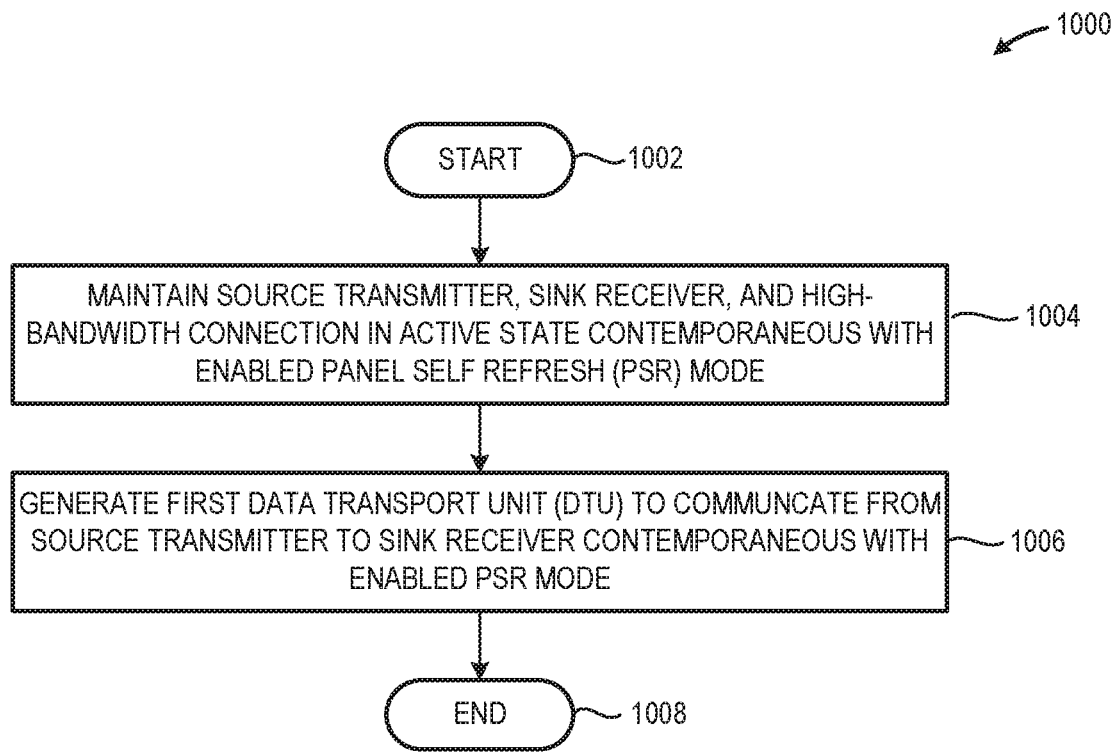
FIG. 10 is a high-level flow diagram of an illustrative method of generating one or more Data Transfer Units (DTUs) to transport bulk data from a source device, such as an SoC, to a sink device, such as an OLED display panel, contemporaneous with ENABLING a modified Panel Self Refresh (PSR) mode in which the source transmitter circuitry, the sink receiver circuitry, and a high-bandwidth connection remain active, in accordance with at least one embodiment described herein.

FIG. 10 is a high-level flow diagram of an illustrative method 1000 of generating one or more Data Transfer Units (DTUs) 122 to transport bulk data 120 from a source device 110, such as an SoC, to a sink device 160, such as an OLED display panel, contemporaneous with ENABLING a modified Panel Self Refresh (PSR) mode in which the source transmitter circuitry 210, the sink receiver circuitry 220, and a high-bandwidth connection 150 remain active, in accordance with at least one embodiment described herein. The method 1000 commences at 1002.

At 1004, the source control circuitry 140 in a source device 110, such as a SoC, ENABLES a modified Panel Self Refresh (PSR) mode in a communicatively coupled sink device 160, such as an OLED display device. Upon ENABLING the modified PSR mode, the source control circuitry 140 maintains at least the source transmitter circuitry 210, the sink receiver circuitry 220, and a high-bandwidth communications link 150 in an active state to facilitate the transfer of one or more data transfer units (DTUs) 122 transporting bulk data 120 from the source device memory circuitry 130 to sink device memory circuitry 180. In embodiments, the bulk data 120 may include data generated by one or more systems, circuits, and/or devices included in the source device 110. Such bulk data 120 may include but is not limited to: OLED compensation data, OLED display firmware data, or combinations thereof.

At 1006, the source control circuitry 140 generates a first DTU 122 to transport at least a portion of the bulk data 120 from the source device 110 to the sink device 160. The DTU 122 includes a header portion that includes information causing the sink device 160 to store the bulk data payload included in the data portion of the DTU 122 in the sink memory circuitry 180. The DTU 122 include a header portion that includes information indicating that the bulk data payload included in the data portion of the DTU 122 includes non-display data. The method 1000 concludes at 1008.

Figure 11:
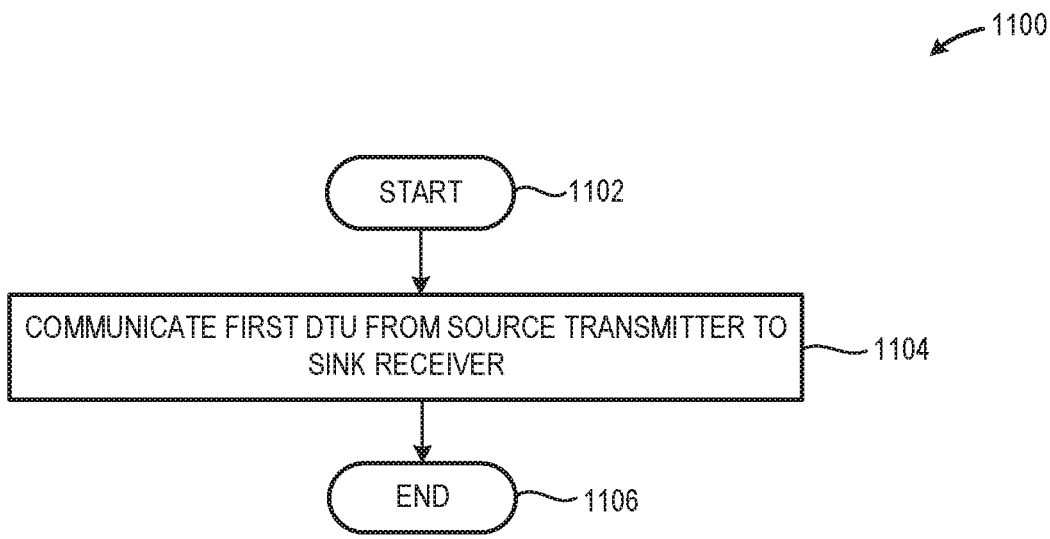
FIG. 11 is a high-level flow diagram of an illustrative method of communicating one or more DTUs transporting bulk data from a source device, such as an SoC, to a sink device, such as an OLED display panel, contemporaneous with ENABLING a modified Panel Self Refresh (PSR) mode in which the source transmitter circuitry, the sink receiver circuitry, and a high-bandwidth connection remain active, in accordance with at least one embodiment described herein.

FIG. 11 is a high-level flow diagram of an illustrative method 1100 of communicating one or more DTUs 122 transporting bulk data 120 from a source device 110, such as an SoC, to a sink device 160, such as an OLED display panel, contemporaneous with ENABLING a modified Panel Self Refresh (PSR) mode in which the source transmitter circuitry 210, the sink receiver circuitry 220, and a high-bandwidth connection 150 remain active, in accordance with at least one embodiment described herein. The method 1100 commences at 1102.

While FIGS. 10 and 11 illustrate various operations according to one or more embodiments, it is to be understood that not all of the operations depicted in FIGS. 10 and 11 are necessary for other embodiments. Indeed, it is fully contemplated herein that in other embodiments of the present disclosure, the operations depicted in FIGS. 10 and 11, and/or other operations described herein, may be combined in a manner not specifically shown in any of the drawings, but still fully consistent with the present disclosure. Thus, claims directed to features and/or operations that are not exactly shown in one drawing are deemed within the scope and content of the present disclosure.

As used in this application and in the claims, a list of items joined by the term "and/or" can mean any combination of the listed items. For example, the phrase "A, B and/or C" can mean A; B; C; A and B; A and C; B and C; or A, B and C. As used in this application and in the claims, a list of items joined by the term "at least one of" can mean any combination of the listed terms. For example, the phrases "at least one of A, B or C" can mean A; B; C; A and B; A and C; B and C; or A, B and C.

As used in any embodiment herein, the terms "system" or "module" may refer to, for example, software, firmware and/or circuitry configured to perform any of the aforementioned operations. Software may be embodied as a software package, code, instructions, instruction sets and/or data recorded on non-transitory computer readable storage mediums. Firmware may be embodied as code, instructions or instruction sets and/or data that are hard-coded (e.g., non-volatile) in memory devices.

As used in any embodiment herein, the term "circuitry" may comprise, for example, singly or in any combination, hardwired circuitry, programmable circuitry such as computer processors comprising one or more individual instruction processing cores, state machine circuitry, and/or firmware that stores instructions executed by programmable circuitry or future computing paradigms including, for example, massive parallelism, analog or quantum computing, hardware embodiments of accelerators such as neural net processors and non-silicon implementations of the above. The circuitry may, collectively or individually, be embodied as circuitry that forms part of a larger system, for example, an integrated circuit (IC), system on-chip (SoC), desktop computers, laptop computers, tablet computers, servers, smartphones, etc.

Any of the operations described herein may be implemented in a system that includes one or more mediums (e.g., non-transitory storage mediums) having stored therein, individually or in combination, instructions that when executed by one or more processors perform the methods. Here, the processor may include, for example, a server CPU, a mobile device CPU, and/or other programmable circuitry. Also, it is intended that operations described herein may be distributed across a plurality of physical devices, such as processing structures at more than one different physical location. The storage medium may include any type of tangible medium, for example, any type of disk including hard disks, floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, Solid State Disks (SSDs), embedded multimedia cards (eMMCs), secure digital input/output (SDIO) cards, magnetic or optical cards, or any type of media suitable for storing electronic instructions. Other embodiments may be implemented as software executed by a programmable control device.

Thus, the present disclosure is directed to systems and methods of transferring bulk data, such as OLED compensation mask data, generated by a source device to a sink device using a high-bandwidth embedded DisplayPort (eDP) connection contemporaneous with an ENABLED Panel Self-Refresh (PSR) mode. Upon ENABLING the PSR mode, the source control circuitry causes the source transmitter circuitry, the sink receiver circuitry, and the eDP high-bandwidth communication link to remain active rather than inactive. The source control circuitry generates one or more data transport units (DTUs) having a header portion that contains data indicative of the presence of a bulk data payload and the non-display status of the bulk data payload carried by the DTUs.

The following examples pertain to further embodiments. The following examples of the present disclosure may comprise subject material such as at least one device, a method, at least one machine-readable medium for storing instructions that when executed cause a machine to perform acts based on the method, means for performing acts based on the method and/or a system for transferring bulk data, such as OLED compensation mask data, generated by a source device to a sink device using a high-bandwidth embedded DisplayPort (eDP) connection contemporaneous with an ENABLED Panel Self-Refresh (PSR) mode.

According to example 1, there is provided a source device. The source device including: source memory circuitry; source transmitter circuitry to communicatively couple to sink receiver circuitry via a high-bandwidth communication link; and source control circuitry communicatively coupled to the source transmitter circuitry, the source control circuitry to: cause a storage of bulk data in the source memory circuitry; in response to ENABLING a Panel Self Refresh (PSR) mode: cause the source transmitter circuit, the sink receiver circuit, and a high-bandwidth communication link between the source transmitter circuit and the to remain in an active state; generate a first data transport unit (DTU) having a header portion that includes data indicative of entry to a PSR/DATA TRANSFER mode and a data portion that includes a bulk data payload; and cause the source transmitter circuitry to communicate the first DTU to the sink receiver circuitry.

Example 2 may include elements of example 1 and the source control circuitry may additionally: maintain the ENABLED PSR mode for the duration of the transfer of the bulk data from the source memory circuitry to the sink receiver circuity.

Example 3 may include elements of examples 1 or 2 and the source control circuitry may additionally: determine whether to maintain the ENABLED PSR mode responsive to a completion of the transfer of the bulk data from the source memory circuitry to the sink receiver circuitry: responsive to a determination to maintain the ENABLED PSR mode: INACTIVATE the high-bandwidth communications link; and cause the source transmitter circuitry to enter a low-power consumption standby mode.

Example 4 may include elements of any of examples 1 through 3 and the source control circuitry may additionally, responsive to a determination to DISABLE the PSR mode: cause the source transmitter circuitry to communicate to the sink receiver circuit at least one DTU having a header portion that includes information indicative of the DISABLEMENT of the PSR mode; and cause the source transmitter circuit to transfer data representative of a new image to the sink device.

Example 5 may include elements of any of examples 1 through 4 where at least a portion of the bulk data comprises OLED display degradation modelling data generated by the source device.

Example 6 may include elements of any of examples 1 through 5 where the source transmitter circuitry comprises Display Port compliant transmitter circuitry.

According to example 7, there is provided a sink device. The sink device may include: sink memory circuitry including: a frame buffer data storage portion; and a bulk data storage portion; sink receiver circuitry coupleable to source transmitter circuitry via a high-bandwidth communications link; and sink control circuitry coupled to the sink memory circuitry, the sink control circuitry to, responsive to receipt of a first data transport unit (DTU) having a header portion and a data portion, the header portion including data indicative of an ENABLED panel self-refresh (PSR) mode: store data representative of a current image in the frame buffer data storage portion of the sink memory circuitry; display the stored image data contemporaneous with the ENABLED PSR mode; and store bulk data received from the source transmitter circuitry in the bulk data storage portion of sink memory circuity.

Example 8 may include elements of example 7 and the sink control circuitry may further: maintain the ENABLED PSR mode for the duration of the transfer of the bulk data to the sink receiver circuitry.

Example 9 may include elements of any of examples 7 or 8 and the sink control circuitry may further: implement at least a portion of the bulk data from the bulk data storage portion of the sink memory circuitry responsive to receipt of at least one implementation frame having a header that includes data indicative of an instruction for the sink device to implement at least a portion of the bulk data.

Example 10 may include elements of any of examples 7 through 9 where at least a portion of the bulk data comprises OLED display degradation modelling data.

Example 11 may include elements of any of examples 7 through 10 where the sink receiver circuitry comprises Display Port compliant receiver circuitry.

According to example 12, there is provided a method of communicating bulk data between a source device and a sink device. The method may include: maintaining, by source control circuitry, a source transmitter circuit, a sink receiver circuit, and a high-bandwidth connection in an ACTIVE state contemporaneous with an ENABLED Panel Self Refresh (PSR) mode; and generating, by the source control circuitry, a first Data Transport Unit (DTU) to communicate from the source transmitter circuit to the sink receiver circuit contemporaneous with the ENABLED Panel Self Refresh (PSR) mode, the first DTU including a header portion containing information indicative of a bulk data transfer and a data portion containing non-display bulk data, wherein the bulk data transfer to occur contemporaneous with at least a portion of the ENABLED PSR.

Example 13 may include elements of example 12 where generating the first Data Transport Unit (DTU) that includes a header portion containing information indicative of a bulk data transfer may further include: generating, by the source control circuitry, the first DTU, wherein the first DTU header portion includes: a first data field that includes information indicative of the PSR bulk data transfer; and a second data field that includes information indicative of the non-display status of the bulk data.

Example 14 may include elements of any of examples 12 or 13 where generating the first DTU, wherein the first DTU header portion includes the first data field that includes the information indicative of the PSR high-speed bulk data transfer, may further include:generating, by the source control circuitry, the first Data Transport Unit (DTU), wherein the first data field in the header portion of the first DTU includes 5-bits indicative of the PSR bulk data transfer.

Example 15 may include elements of any of examples 12 through 14 where generating the first DTU, wherein the first DTU header portion includes the second data field that includes the information indicative of the non-display status of the bulk data, may include: generating, by the source control circuitry, the first Data Transport Unit (DTU), wherein the second data field in the header portion of the first DTU includes 5-bits indicative of the non-display status of the bulk data.

Example 16 may include elements of any of examples 12 through 15, and the method may further include: generating, by the source control circuitry, a second Data Transport Unit (DTU) to communicate from the source transmitter circuit to the sink receiver circuit contemporaneous with the ENABLED Panel Self Refresh (PSR) mode, the second DTU including a header portion containing information indicative of a bulk data payload carried by the second DTU.

Example 17 may include elements of any of examples 12 through 16 where generating a second DTU to communicate to the sink device during the PSR, the second DTU including a first data field indicative of a bulk data payload carried by the second DTU may include: generating, by the source control circuitry, a second DTU to communicate to the sink device during the PSR, the second DTU including a first data field containing 1-bit to indicate the data portion of the second DTU includes a bulk data payload.

According to example 18, there is provided a system for communicating bulk data between a source device and a sink device. The system may include: means for maintaining a source transmitter circuit, a sink receiver circuit, and a high-bandwidth connection in an ACTIVE state contemporaneous with an ENABLED Panel Self Refresh (PSR) mode; and means for generating a first Data Transport Unit (DTU) to communicate from the source transmitter circuit to the sink receiver circuit contemporaneous with the ENABLED Panel Self Refresh (PSR) mode, the first DTU including a header portion containing information indicative of a bulk data transfer and a data portion containing non-display bulk data, wherein the bulk data transfer to occur contemporaneous with at least a portion of the ENABLED PSR.

Example 19 may include elements of example 18 where the means for generating the first Data Transport Unit (DTU) that includes a header portion containing information indicative of a bulk data transfer may include: means for generating the first DTU, wherein the first DTU header portion includes: a first data field that includes information indicative of the PSR bulk data transfer; and a second data field that includes information indicative of the non-display status of the bulk data.

Example 20 may include elements of any of example 18 or 19 where the means for generating the first DTU, wherein the first DTU header portion includes the first data field that includes the information indicative of the PSR high-speed bulk data transfer, may include: means for generating the first Data Transport Unit (DTU), wherein the first data field in the header portion of the first DTU includes 5-bits indicative of the PSR bulk data transfer.

Example 21 may include elements of any of examples 18 through 20 where the means for generating the first DTU, wherein the first DTU header portion includes the second data field that includes the information indicative of the non-display status of the bulk data, may include: means for generating the first Data Transport Unit (DTU), wherein the second data field in the header portion of the first DTU includes 5-bits indicative of the non-display status of the bulk data.

Example 22 may include elements of any of examples 18 through 21, and the system may further include: means for generating a second Data Transport Unit (DTU) to communicate from the source transmitter circuit to the sink receiver circuit contemporaneous with the ENABLED Panel Self Refresh (PSR) mode, the second DTU including a header portion containing information indicative of a bulk data payload carried by the second DTU.

Example 23 may include elements of any of examples 18 through 22 where the means for generating a second DTU to communicate to the sink device during the PSR, the second DTU including a first data field indicative of a bulk data payload carried by the second DTU may include: means for generating a second DTU to communicate to the sink device during the PSR, the second DTU including a first data field containing 1-bit to indicate the data portion of the second DTU includes a bulk data payload.

According to example 24, there is provided a non-transitory storage device. The non-transitory storage device includes instructions that, when executed by source control circuitry, cause the source control circuitry to: cause a storage of bulk data in the source memory circuitry; in response to ENABLING a Panel Self-Refresh (PSR) mode: cause the source transmitter circuit, the sink receiver circuit, and a high-bandwidth communication link between the source transmitter circuit and the to remain in an active state; generate a first data transport unit (DTU) having a header portion that includes data indicative of entry to a PSR/DATA TRANSFER mode and a data portion that includes a bulk data payload; and cause the source transmitter circuitry to communicate the first DTU to the sink receiver circuitry.

Example 25 may include elements of example 24 where the instructions further cause the source control circuitry to: maintain the ENABLED PSR mode for the duration of the transfer of the bulk data from the source memory circuitry to the sink receiver circuitry.

Example 26 may include elements of any of examples 24 or 25 where the instructions further cause the source control circuitry to: determine whether to maintain the ENABLED PSR mode responsive to a completion of the transfer of the bulk data from the source memory circuitry to the sink receiver circuitry: responsive to a determination to maintain the ENABLED PSR mode: INACTIVATE the high-bandwidth communications link; and cause the source transmitter circuitry to enter a low-power consumption standby mode.

Example 27 may include elements of any of examples 24 through 26 where the instructions further cause the source control circuitry to: responsive to a determination to DISABLE the PSR mode: cause the source transmitter circuitry to communicate to the sink receiver circuit at least one DTU having a header portion that includes information indicative of the DISABLEMENT of the PSR mode; and cause the source transmitter circuit to transfer data representative of a new image to the sink device.

Example 28 may include elements of any of examples 24 through 27 where the instructions further cause the source control circuitry to: generate bulk data that includes OLED display compensation data.

According to example 29, there is provided a non-transitory storage device. The non-transitory storage device includes instructions that, when executed by sink control circuitry disposed in a sink device, cause the sink control circuitry to: store data representative of a current image in the frame buffer data storage portion of the sink memory circuitry; display the stored image data contemporaneous with the ENABLED PSR mode; and store bulk data received from the source transmitter circuitry in the bulk data storage portion of sink memory circuitry.

Example 30 may include elements of example 29 where the instructions further cause the sink control circuitry to: maintain the ENABLED PSR mode for the duration of the transfer of the bulk data to the sink receiver circuity.

According to example 31, there is provided an electronic device. The electronic device may include: a source device that includes source control circuitry having DisplayPort (DP) interface; a sink device that includes sink control circuitry having a DP interface, the sink device coupled to the source device via a DP communications link; wherein, the source control circuitry to: generate bulk data; generate a first data transfer unit (DTU) having a header portion and a data portion, the header portion including data indicative of an ENABLED Panel Self-Refresh (PSR) mode; maintain source transmitter circuitry, sink receiver circuitry and the DP communications link in an active state contemporaneous with the ENABLED PSR mode; communicate the first DTU to the sink device via the DP communications link; communicate one or more second DTUs to the sink device, each of the one or more second DTUs including a header portion that includes information that identifies the respective second DTU as containing at least a portion of the bulk data and an indicator that the bulk data included in the respective DTU represents non-display data; wherein, the sink device includes circuitry to: receive the first DTU; enter a Panel Self-Refresh (PSR) mode to cause a display of data stored in frame buffer memory circuitry local to the sink device; receive the one or more second DTUs; and store the bulk data contained in the data portion of each of the one or more second DTUs in sink memory circuitry.

Example 32 may include elements of example 31 where the source device comprises a system-on-chip (SoC).

Example 33 may include elements of any of examples 31 or 32 where the source control circuitry includes graphical processor circuitry.

Example 34 may include elements of any of examples 31 through 33 where the sink device comprises one or more display devices.

Example 35 may include elements of any of examples 31 through 34 where the one or more display devices comprise an organic light emitting diode (OLED) display device.

Example 36 may include elements of any of examples 31 through 35 where the bulk data comprises OLED compensation data generated by the SoC source device.

Example 37 may include elements of any of examples 31 through 36 where the first DTU comprises an extended DisplayPort (eDP) frame that includes: a first data field in the header data, the first data field including data indicative of the ENABLED PSR mode.

Example 38 may include elements of any of examples 31 through 37 where the first data field comprises a 5-bit data field.

Example 39 may include elements of any of examples 31 through 38 where the eDP frame further includes: a second data field in the header data, the first data field including data indicative of a bulk data type.

Example 40 may include elements of any of examples 31 through 39 where the second data field comprises a 5-bit data field.

Example 41 may include elements of any of examples 31 through 40 where the second DTU comprises an extended DisplayPort (eDP) frame that includes: a first data field in the header data, the first data field including data indicative of the bulk data included in the respective DTU represents non-display data.

Example 42 may include elements of any of examples 31 through 41 where the first data field comprises a 1-bit data field.

According to example 43, there is provided a system to communicate bulk data from a source device to a sink device during a Panel Self-Refresh (PSR) mode via a high-bandwidth connection, the system being arranged to perform the method of any of examples 12 through 17.

According to example 44, there is provided a chipset arranged to perform the method of any of examples 12 through 17.

According to example 45, there is provided at least one machine readable medium comprising a plurality of instructions that, in response to be being executed on a computing device, cause the computing device to carry out the method according to any of examples 12 through 17.

According to example 46, there is provided a device configured to communicate bulk data from a source device to a sink device during a Panel Self-Refresh (PSR) mode via a high-bandwidth connection, the device being arranged to perform the method of any of examples 12 through 17.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

As described herein, various embodiments may be implemented using hardware elements, software elements, or any combination thereof. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth.

Reference throughout this specification to "one embodiment" or "an embodiment" means that a particular feature, structure, or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

What is claimed:

1. A source device comprising:
   source memory circuitry;
   source transmitter circuitry to communicatively couple to sink receiver circuitry via a high-bandwidth communication link; and
   source control circuitry communicatively coupled to the source transmitter circuitry, the source control circuitry to:
   cause a storage of bulk data in the source memory circuitry;
   cause the sink receiver circuitry to enter an enabled state of a Panel Self Refresh (PSR) mode;
   cause the source transmitter circuitry, the sink receiver circuitry, and a high-bandwidth communication link between the source transmitter circuit and the sink receiver circuitry to remain in an active state while in the PSR mode;
   generate a first data transport unit (DTU) having a header portion that includes data indicative of entry to a PSR/DATA TRANSFER mode and a data portion that includes a bulk data payload; and
   cause the source transmitter circuitry to communicate the first DTU to the sink receiver circuitry.

2. The source device of claim 1, wherein the source control circuitry is to maintain the enabled state of the PSR mode for a duration of the transfer of the bulk data from the source memory circuitry to the sink receiver circuitry.

3. The source device of claim 1, wherein the source control circuitry is to:
   determine whether to maintain the enabled state of the PSR mode responsive to a completion of the transfer of the bulk data from the source memory circuitry to the sink receiver circuitry:
   responsive to a determination to maintain the enabled state of the PSR mode:
   inactivate the high-bandwidth communications link; and
   cause the source transmitter circuitry to enter a low-power consumption standby mode.

4. The source device of claim 3, the source control circuitry to further:
   responsive to a determination to disable the PSR mode:
   cause the source transmitter circuitry to communicate to the sink receiver circuitry at least one DTU having a header portion that includes information indicative of the disablement of the PSR mode; and
   cause the source transmitter circuit to transfer data representative of a new image to a sink device.

5. The source device of claim 1, wherein the at least a portion of the bulk data includes OLED (organic light emitting diode) display degradation modelling data generated by the source device.

6. The source device of claim 1, wherein the source transmitter circuitry includes Display Port compliant transmitter circuitry.

7. A sink device, comprising:
   sink memory circuitry including:
   a frame buffer data storage portion; and
   a bulk data storage portion;
   sink receiver circuitry coupleable to source transmitter circuitry via a high-bandwidth communications link; and
   sink control circuitry coupled to the sink memory circuitry, the sink control circuitry to, responsive to receipt of a first data transport unit (DTU) having a header portion and a data portion, the header portion including data indicative of a panel self-refresh (PSR) mode in an enabled state:
store data representative of a current image in the frame buffer data storage portion of the sink memory circuitry;
display the stored data contemporaneous with the enabled state of the PSR mode; and
store bulk data received from the source transmitter circuitry in the bulk data storage portion of the sink memory circuitry, the bulk data received in a plurality of additional DTUs after the first DTU, the plurality of additional DTUs received contemporaneously to the PSR mode in the enabled state.

8. The sink device of claim 7, wherein the sink control circuitry is to maintain the enabled state of the PSR mode for a duration of the transfer of the bulk data to the sink receiver circuitry.

9. The sink device of claim 7, wherein the sink receiver circuitry is to implement at least a portion of the bulk data from the bulk data storage portion of the sink memory circuitry responsive to receipt of at least one implementation frame having a header that includes data indicative of an instruction for the sink device to implement at least a portion of the bulk data.

10. The sink device of claim 7, wherein at least a portion of the bulk data includes OLED (organic light emitting diode) display degradation modelling data.

11. The sink device of claim 7, wherein the sink receiver circuitry includes Display Port compliant receiver circuitry.

12. An electronic device, comprising:
a source device that includes source control circuitry having DisplayPort (DP) interface;
a sink device that includes sink control circuitry having a DP interface, the sink device coupled to the source device via a DP communications link;
wherein, the source control circuitry to:
generate bulk data;
generate a first data transfer unit (DTU) having a header portion and a data portion, the header portion including data indicative of a Panel Self-Refresh (PSR) mode in an enabled state;
maintain source transmitter circuitry, sink receiver circuitry and the DP communications link in an active state contemporaneous with the PSR mode in the enabled state;
communicate the first DTU to the sink device via the DP communications link;
communicate one or more second DTUs to the sink device, each of the one or more second DTUs including a header portion that includes information that identifies the respective second DTU as containing at least a portion of the bulk data and an indicator that the bulk data included in the respective second DTU represents non-display data;
wherein, the sink device includes circuitry to:
receive the first DTU;
enter the PSR mode to cause a display of data stored in frame buffer memory circuitry local to the sink device;
receive the one or more second DTUs; and
store the bulk data contained in the data portion of each of the one or more second DTUs in sink memory circuitry.

13. The electronic device of claim 12, wherein the source device includes a system-on-chip (SoC).

14. The electronic device of claim 13, wherein the source control circuitry includes graphical processor circuitry.

15. The electronic device of claim 13, wherein the sink device includes one or more display devices.

16. The electronic device of claim 15, wherein the one or more display devices include an organic light emitting diode (OLED) display device.

17. The electronic device of claim 14, wherein the bulk data includes OLED compensation data generated by the source device.

18. The electronic device of claim 12, wherein the first DTU includes an extended DisplayPort (eDP) frame that includes a first data field in the header data, the first data field including data indicative of the PSR mode in the enabled state.

19. The electronic device of claim 18 wherein the first data field includes a 5-bit data field.

20. The electronic device of claim 18, wherein the eDP frame further includes a second data field in the header data, the first data field including data indicative of a bulk data type.

21. The electronic device of claim 20, wherein the second data field includes a 5-bit data field.

22. The electronic device of claim 12, wherein the one or more second DTUs includes an extended DisplayPort (eDP) frame that includes a first data field in the header data, the first data field including data indicative of the bulk data included in the respective DTU represents non-display data.

23. The electronic device of claim 22, wherein the first data field includes a 1-bit data field.

24. A non-transitory storage device that includes instructions that, when executed by source control circuitry, causes the source control circuitry to:
cause a storage of bulk data in a source memory circuitry;
cause a sink receiver circuitry to enter an enabled state of a Panel Self-Refresh (PSR) mode:
cause a source transmitter circuitry, the sink receiver circuitry, and a high-bandwidth communication link between the source transmitter circuitry and the sink receiver circuitry to remain in an active state while in the PSR mode;
generate a first data transport unit (DTU) having a header portion that includes data indicative of entry to a PSR/DATA TRANSFER mode and a data portion that includes a bulk data payload; and
cause the source transmitter circuitry to communicate the first DTU to the sink receiver circuitry.

25. The non-transitory storage device of claim 24, wherein the instructions further cause the source control circuitry to maintain the enabled state of the PSR mode for a duration of the transfer of the bulk data from the source memory circuitry to the sink receiver circuitry.

26. The non-transitory storage device of claim 24, wherein the instructions further cause the source control circuitry to:
determine whether to maintain the enabled state of the PSR mode responsive to a completion of the transfer of the bulk data from the source memory circuitry to the sink receiver circuitry:
responsive to a determination to maintain the enabled state of the PSR mode:
inactivate the high-bandwidth communications link; and
cause the source transmitter circuitry to enter a low-power consumption standby mode.

27. The non-transitory storage device of claim 26, wherein the instructions further cause the source control circuitry to:

responsive to a determination to disable the PSR mode:
cause the source transmitter circuitry to communicate to the sink receiver circuit at least one DTU having a header portion that includes information indicative of the disablement of the PSR mode; and
cause the source transmitter circuit to transfer data representative of a new image to a sink device.

28. The non-transitory storage device of claim 24, wherein the instructions further cause the source control circuitry to generate bulk data that includes OLED (organic light emitting diode) display compensation data.

29. A non-transitory storage device containing instructions that, when executed by sink control circuitry disposed in a sink device, cause the sink control circuitry to:
store data representative of a current image in a frame buffer data storage portion of a sink memory circuitry;
display the stored data contemporaneous with a Panel Self-Refresh (PSR) mode in an enabled state; and
store bulk data received from a source transmitter circuitry in a bulk data storage portion of the sink memory circuitry, the bulk data received contemporaneously to the PSR mode in the enabled state.

30. The non-transitory storage device of claim 29, wherein the instructions further cause the sink control circuitry to maintain the enabled state of the PSR mode for a duration of a transfer of the bulk data from the source transmitter circuitry.

* * * * *